(12) United States Patent
Emrick et al.

(10) Patent No.: US 9,991,443 B2
(45) Date of Patent: Jun. 5, 2018

(54) CONJUGATED POLYMER ZWITTERIONS AND SOLAR CELLS COMPRISING CONJUGATED POLYMER ZWITTERIONS

(71) Applicant: The University of Massachusetts, Boston, MA (US)

(72) Inventors: Todd Emrick, Amherst, MA (US); Thomas Russell, Amherst, MA (US); Zachariah Page, Amherst, MA (US); Yao Liu, Amherst, MA (US)

(73) Assignee: THE UNIVERSITY OF MASSACHUSETTS, Boston, MA (US)

( * ) Notice: Subject to any disclaimer, the term of this patent is extended or adjusted under 35 U.S.C. 154(b) by 284 days.

(21) Appl. No.: 15/056,395

(22) Filed: Feb. 29, 2016

(65) Prior Publication Data
US 2016/0260903 A1 Sep. 8, 2016

Related U.S. Application Data

(60) Provisional application No. 62/128,211, filed on Mar. 4, 2015.

(51) Int. Cl.
*H01L 51/00* (2006.01)
*C08G 75/32* (2006.01)
(Continued)

(52) U.S. Cl.
CPC .......... *H01L 51/0036* (2013.01); *C08G 75/00* (2013.01); *C08G 75/32* (2013.01);
(Continued)

(58) Field of Classification Search
CPC . H01L 51/0036; H01L 51/0043; C08G 75/00; C08G 75/32
(Continued)

(56) References Cited

FOREIGN PATENT DOCUMENTS

WO 2015171689 A1 11/2015

OTHER PUBLICATIONS

Ha et al., 2,5-Bis(2-octyldodecyl)pyrrolo[3,4-c]pyrrole-1,4-(2H,5H)-dione-Based Donor-Acceptor Alternating Copolymer Bearing 5,50-Di(thiophen-2-yl)-2,20-biselenophene Exhibiting 1.5 cm2•3 V-1•s-1 Hole Mobility in Thin-Film Transistors, JACS,vol./Issue 133, pp. 10364-10367 (Year: 2011).*
(Continued)

*Primary Examiner* — Jayne L Mershon
(74) *Attorney, Agent, or Firm* — Cantor Colburn LLP

(57) ABSTRACT

A conjugated polymer zwitterion includes repeating units having structure (I), (II), or a combination thereof (Continued)

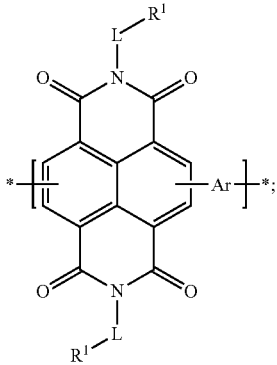

wherein Ar is independently at each occurrence a divalent substituted or unsubstituted $C_{3-30}$ arylene or heteroarylene group; L is independently at each occurrence a divalent $C_{1-16}$ alkylene group, $C_{6-30}$ arylene or heteroarylene group, or alkylene oxide group; and $R^1$ is independently at each occurrence a zwitterion. A polymer solar cell including the conjugated polymer zwitterion is also disclosed.

20 Claims, 5 Drawing Sheets

(51) Int. Cl.
C08G 75/00 (2006.01)
H01L 51/42 (2006.01)
(52) U.S. Cl.
CPC ...... *H01L 51/0043* (2013.01); *H01L 51/0053* (2013.01); *H01L 51/4273* (2013.01); *H01L 51/0037* (2013.01); *H01L 2251/308* (2013.01); *Y02E 10/549* (2013.01)
(58) Field of Classification Search
USPC ........................................................ 136/263
See application file for complete search history.

(56) References Cited

OTHER PUBLICATIONS

Sundaram et al., One-Step Dip Coating of Zwitterionic Sulfobetaine Polymers on Hydrophobic and Hydrophilic Surfaces, ACS Applied Materials & Interfaes, vol./Issue 6, pp. 6664-6671 (Year: 2014).*
B. Worfolk et al., "Work Function Control of Interfacial Buffer Layers for Efficient and Air-Stable Inverted Low-Bandgap Organic Photovoltaics", Adv. Energy Mater. 2012, 2; DOI: 10.1002/aenm. 201100714; pp. 361-368.
C. Chueh et al. "Toward High-Performance Semi-Transparent Polymer Solar Cells: Optimization of Ultra-Thin Light Absorbing Layer and Transparent Cathode Architecture", Advanced Energy Materials, 2013, 3; DOI: 10.1002/aenm.201200679; pp. 417-423.
C. Duan et al., "Highly Efficient Inverted Polymer Solar Cells Based on an Alcohol Soluble Fullerene Derivative Interfacial Modification Material", Chem. Mater. 2012, 24; dx.doi.org/10.1021/cm300824h; pp. 1682-1689.
C. Duan, et al., "Conjugated zwitterionic polyelectrolyte-based interface modification materials for high performance polymer optoelectronic devices", Chem. Sci., 2013, 4; DOI: 10.1039/c3sc22258f; pp. 1298-1307.
C. Gu et al., "Achieving High Efficiency of PTB7-Based Polymer Solar Cells via Integrated Optimization of Both Anode and Cathode Interlayers", Adv. Energy Mater. 2014; DOI: 10.1002/aenm. 201301771; 5 pages.

F. Liu et al., "Conjugated Polymeric Zwitterions as Efficient Interlayers in Organic Solar Cells", Advanced Materials, 2013, 25; pp. 6868-6873.
H. Usta et al., "Dithienosilole- and Dibenzosilole-Thiophene Copolymers as Semiconductors for Organic Thin-Film Transistors", J. Am. Chem. Soc. 2006, 128; 10.1021/ja062908g; pp. 9034-9035.
H-L. Yip et al., "Recent advances in solution-processed interfacial materials for efficient and stable polymer solar cells" Energy Environ. Sci., 2012, 5, pp. 5994-6011.
J. Jo et al.,"Enhanced Efficiency of Single and Tandem Organic Solar Cells Incorporating a Diketopyrrolopyrrole-Based Low-Bandgap Polymer by Utilizing Combined ZnO/ Polyelectrolyte Electron-Transport Layers",Adv.Mater; DOI:10.1002/adma. 201301288; pp. 1-6.
J.H. Seo et al., "Improved High-Efficiency Organic Solar Cells via Incorporation of a Conjugated Polyelectrolyte Interlayer", J. Am. Chem. Soc. 2011, 133; dx.doi.org/10.1021/ja2037673; pp. 8416-8419.
K. O'Malley et al., "Enhanced Open-Circuit Voltage in High Performance Polymer/Fullerene Bulk-Heterojunction Solar Cells by Cathode Modification with a C60 Surfactant", Advanced Energy Materials 2012, 2, DOI: 10.1002/aenm.201100522; pp. 82-86.
K. Yao et al., "A General Route to Enhance Polymer Solar Cell Performance using Plasmonic Nanoprisms", Advanced Entergy Materials, 2014, DOI: 10.1002/aenm.201400206; 7 pages.
L. Chang-Zhi et al., "Suppressed Charge Recombination in Inverted Organic Photovoltaics via Enhanced Charge Extraction by Using a Conductive Fullerene Electron Transport Layer", Advanced Materials, 2014, 26; DOI: 10.1002/adma.201402276; pp. 6262-6267.
L. Shusheng et al., "[6,6]-Phenyl-C61-Butyric Acid Dimethylamino Ester as a Cathode Buffer Layer for High-Performance Polymer Solar Cells", Advanced Energy Materials, 2013; DOI: 10.1002/aenm.201300425; pp. 1-6.
L. Yu-Ying et al., "Interface Engineering to Enhance the Efficiency of Conventional Polymer Solar Cells by Alcohol-/Water-Soluble C 60 Materials Doped with Alkali Carbonates", ACS Applied Materials & Interfaces, 2013, 5; dx.doi.org/10.10 pp. 5122-5128.
Q. Mei et al., "Enhancing the Performance of Polymer Photovoltaic Cells by Using an Alcohol Soluble Fullerene Derivative as the Interfacial Layer", ACS Applied Materials & Interfaces, 2013, 5, dx.doi.org/10.1021/am402157b; pp. 8076-8080.
R. Kang et al., "Influence of the Ionic Functionalities of Polyfluorene Derivatives as a Cathode Interfacial Layer on Inverted Polymer Solar Cells", ACS Appl. Mater. Interfaces 2014, 6; dx.doi. org/10.1021/am500708k; pp. 6227-6236.
S. Woo et al., "8.9% Single-Stack Inverted Polymer Solar Cells with Electron-Rich Polymer Nanolayer-Modified Inorganic Electron-Collecting Buffer Layers", Adv. Energy Mater. 2014, 4; DOI: 10.1002/aenm.201301692; 7 pages.
W. Zhang et al., "Morphological Control for Highly Efficient Inverted Polymer Solar Cells via the Backbone Design of Cathode Interlayer Materials", Advanced Energy Materials, 2014, DOI: 10.1002/aenm.201400359, 5 pages.
X. Guo et al., "Conjugated Polymers from Naphthalene Bisimide", American Chemical Society: Organic Letters vol. 10, No. 23, 2008; pp. 5333-5336.
X. Guo et al., "Enhanced Photovoltaic Performance by Modulating Surface Composition in Bulk Heterojunction Plymer Solar Cells Based on PBDTTT-C-T/PC71BM", Advanced Materials, 2014, 26, DOI:10.1002/adma.201400411; pp. 4043-4049.
X. Li et al. "High performance polymer solar cells with a polar fullerene derivative as the cathode buffer layer", Journal of Materials Chemistry A, 2013, 1,; DOI: 10.1039/c3ta12875j; pp. 12413-12416.
X. Yang et al., "High-Efficiency Polymer Solar Cells Achieved by Doping Plasmonic Metallic Nanoparticles into Dual Charge Selecting Interfacial Layers to Enhance Light Trapping", Advanced Energy Materials, 2013,3,DOI: 10.1002/aenm.201200726; pp. 666-673.
Y. Zhou et al., "A Universal Method to Produce Low-Work Function Electrodes for Organic Electronics", Science 336, (2012); DOI: 10.1126/science.1218829; pp. 327-332.

(56) References Cited

OTHER PUBLICATIONS

Z. He et al., "Recent Advances in Polymer Solar Cells: Realization of High Device Performance by Incorporating Water/Alcohol-Soluble Conjugated Polymers as Electrode Buffer Layer", Advanced Materials, 2014, 26, pp. 1006-1024.

Z. He et al., "Simultaneous Enhancement of Open-Circuit Voltage, Short-Circuit Current Density, and Fill Factor in Polymer Solar Cells", Adv. Mater. 2011, 23; DOI: 10.1002/adma.201103006; pp. 4636-4643.

Z. He et al. "Enhanced power-conversion efficiency in polymer solar cells using an inverted device structure", Nature Photonics, vol. 6; 2012, DOI: 10.1038/NPHOTON.2012.190; pp. 591-595.

Z. Page et al. "Rapid facile synthesis of conjugated polymer zwitterions in ionic liquids", The Royal Society of Chemistry, Chem. Sci., 2014, 5; pp. 2368-2373.

Z. Page et al., "Conjugated Thiophene-Containing Polymer Zwitterions: Direct Syntheseis and Thin Film Electronic Properties"; American Chemical Society, Macromolecules, 2013, 46; pp. 344-351.

Z. Page et al., "Fulleropyrrolidine interlayers: Tailoring electrodes to raise organic solar cell efficiency", Science 346, 441 (2014); DOI: 10.1126/science.1255826; pp. 441-444.

Z. Page et al., "Tuning the Energy Gap of Conjugated Polymer Zwitterions for Efficient Interlayers and Solar Cells", Journal of Polymer Science, Part A: Polymer Chemistry; 2015, 53; pp. 327-336.

Z-G. Zhang et al., "Perylene diimides: a thickness-insensitive cathode interlayer for high performance polymer solar cells", Energy & Environ. Sci., 2014, 7; DOI: 10.1039/c4ee00022f; pp. 1966-1973.

* cited by examiner

CONJUGATED POLYMER ZWITTERIONS AND SOLAR CELLS COMPRISING CONJUGATED POLYMER ZWITTERIONS

STATEMENT REGARDING FEDERALLY SPONSORED RESEARCH & DEVELOPMENT

This invention was made with government support under award number DE-SC0001087 awarded by the U.S. Department of Energy (DOE), Office of Basic Energy Sciences. The government has certain rights in the invention.

BACKGROUND

Polymer solar cells (PSCs) provide an avenue to inexpensive renewable energy by large scale printing of lightweight and flexible materials. PSCs typically comprise multiple layers, where efficient electronic communication at each interface is crucial for achieving high efficiency. As such, interfacial engineering is needed to enhance device performance. See, e.g., Yip, H.-L.; Jen, A. K.-Y. *Energy Environ. Sci.* 2012, 5, 5994; He, Z.; Wu, H.; Cao, Y. *Adv. Mater.* 2014, 26, 1006. For example, interlayers located between the active layer and conductive electrodes improve the selectivity of charge transport, and minimize series resistance, leading to PCE values exceeding 9% for single junction PSCs. See, e.g., He, Z.; Thong, C.; Su, S.; Xu, M.; Wu, H.; Cao, Y. *Nat. Photonics* 2012, 6, 591; Yao, K.; Salvador, M.; Chueh, C.; Xin, X.; Xu, Y.; Dane, W.; Hu, T.; Chen, Y.; Ginger, D. S.; Jen, A. K. *Adv. Energy Mater.* 2014, 4, 1400206; Zhang, W.; Wu, Y.; Bao, Q.; Gao, F.; Fang, J. *Adv. Energy Mater.* 2014, 4, 1400359; Guo, X.; Zhang, M.; Ma, W.; Ye, L.; Zhang, S.; Liu, S.; Ade, H.; Huang, F.; Hou, J. *Adv. Mater.* 2014, 26, 4043; Li, C.-Z.; Chang, C.-Y.; Zang, Y.; Ju, H.-X.; Chueh, C.-C.; Liang, P.-W.; Cho, N.; Ginger, D. S.; Jen, A. K.-Y. *Adv. Mater.* 2014. doi: 10.1002/adma.201402276. For example, a blend of poly(ethylenedioxythiophene) and poly(styrene sulfonate) (PEDOT:PSS) functions as a solution processable hole-selective anode modification layer that has evolved into standard use in PSCs. Recent efforts have been devoted to developing new cathode modification layers to enhance electron extraction efficiency. Numerous organic small molecule interlayers have been integrated into PSCs with noteworthy device improvements, such as functional fullerenes and perylenediimides and oligomeric fluorenes. See, e.g., Yao, K.; Salvador, M.; Chueh, C.; Xin, X.; Xu, Y.; Dane, W.; Hu, T.; Chen, Y.; Ginger, D. S.; Jen, A. K. *Adv. Energy Mater.* 2014, 4, 1400206; Page, Z. a.; Liu, Y.; Duzhko, V. V.; Russell, T. P.; Emrick, T. *Science.* 2014, 346, 441; O'Malley, K. M.; Li, C.-Z.; Yip, H.-L.; Jen, A. K.-Y. *Adv. Energy Mater.* 2012, 2, 82; Yang, X.; Chueh, C.; Li, C.; Yip, H.; Yin, P.; Chen, H.; Chen, W.; Jen, A. K. *Adv. Energy Mater.* 2013, 3, 666; Chueh, C.; Chien, S.; Yip, H.; Salinas, J. F.; Li, C.; Chen, K.; Chen, F.; Chen, W.; Jen, A. K. *Adv. Energy Mater.* 2013, 3, 417; Mei, Q.; Li, C.; Gong, X.; Lu, H.; Jin, E.; Du, C.; Lu, Z.; Jiang, L.; Meng, X.; Wang, C.; Bo, Z. *ACS Appl. Mater. Interfaces* 2013, 5, 8076; Li, S.; Lei, M.; Lv, M.; Watkins, S. E.; Tan, Z.; Zhu, J.; Hou, J.; Chen, X.; Li, Y. *Adv. Energy Mater.* 2013, 3, 1569; Lai, Y.-Y.; Shih, P.-I.; Li, Y.-P.; Tsai, C.-E.; Wu, J.-S.; Cheng, Y.-J.; Hsu, C.-S. *ACS Appl. Mater. Interfaces* 2013, 5, 5122; Li, X.; Zhang, W.; Wu, Y.; Min, C.; Fang, J. *J. Mater. Chem.* 2013, 1, 12413; Duan, C.; Zhong, C.; Liu, C.; Huang, F.; Cao, Y. *Chem. Mater.* 2012, 24, 1682; Zhang, Z.-G.; Qi, B.; Jin, Z.; Chi, D.; Qi, Z.; Li, Y.; Wang, J. *Energy Environ. Sci.* 2014, 7, 1966; Zhang, W.; Wu, Y.; Bao, Q.; Gao, F.; Fang, J. *Adv. Energy Mater.* 2014, 4, 1400359. Polymer interlayers provide advantages of both facile solution processing and robust film formation, with two recently reported examples being poly(ethyleneimine) (PEI) and tertiary-amine substituted polyfluorene (PFN). See, e.g., Zhou, Y.; Fuentes-Hernandez, C.; Shim, J.; Meyer, J.; Giordano, A. J.; Li, H.; Winget, P.; Papadopoulos, T.; Cheun, H.; Kim, J.; Fenoll, M.; Dindar, A.; Haske, W.; Najafabadi, E.; Khan, T. M.; Sojoudi, H.; Barlow, S.; Graham, S.; Brédas, J.-L.; Marder, S. R.; Kahn, A.; Kippelen, B. *Science.* 2012, 336, 327; Woo, S.; Hyun Kim, W.; Kim, H.; Yi, Y.; Lyu, H.-K.; Kim, Y. *Adv. Energy Mater.* 2014, 4, 1301692; Gu, C.; Chen, Y.; Zhang, Z.; Xue, S.; Sun, S.; Zhong, C.; Zhang, H.; Lv, Y.; Li, F.; Huang, F.; Ma, Y. *Adv. Energy Mater.* 2014, 4, 1301771.

Cathode modification layers lead to negative interfacial dipoles ($\Delta$) that lower the electrode work function and increase the electrostatic potential across the device. See, e.g., Worfolk, B. J.; Hauger, T. C.; Harris, K. D.; Rider, D. a.; Fordyce, J. a. M.; Beaupré, S.; Leclerc, M.; Buriak, J. M. *Adv. Energy Mater.* 2012, 2, 361. This enables the use of stable, high work function metals in devices, while the enhanced E-field increases free charge generation and extraction efficiency to maximize short-circuit current density ($J_{SC}$) and fill factor (FF). The interfacial dipole moreover increases the anode-cathode work function offset ($\Phi_{A-C}$), thus enhancing open circuit voltage ($V_{OC}$). See, e.g., He, Z.; Zhong, C.; Huang, X.; Wong, W.; Wu, H.; Chen, L.; Su, S.; Cao, Y. *Adv. Mater.* 2011, 23, 4636. Polar semiconducting polymers, such as conjugated polyelectrolytes (CPEs) and conjugated polymer zwitterions (CPZs), provide large negative $\Delta$ values, with an inherent tunability of electronic properties. See, e.g., Seo, J. H.; Gutacker, A.; Sun, Y.; Wu, H.; Huang, F.; Cao, Y.; Scherf, U.; Heeger, A. J.; Bazan, G. C. *J. Am. Chem. Soc.* 2011, 133, 8416; Jo, J.; Pouliot, J.-R.; Wynands, D.; Collins, S. D.; Kim, J. Y.; Nguyen, T. L.; Woo, H. Y.; Sun, Y.; Leclerc, M.; Heeger, A. J. *Adv. Mater.* 2013, 25, 4783; Kang, R.; Oh, S.; Kim, D. *ACS Appl. Mater. Interfaces* 2014, 6, 6227; Liu, F.; Page, Z.; Duzhko, V.; Russell, T. P.; Emrick, T. *Adv. Mater.* 2013, 25, 6868; Duan, C.; Zhang, K.; Guan, X.; Zhong, C.; Xie, H.; Huang, F.; Chen, J.; Peng, J.; Cao, Y. *Chem. Sci.* 2013, 4, 1298; Page, Z. A.; Liu, F.; Russell, T. P.; Emrick, T. *Chem. Sci.* 2014, 5, 2368; Page, Z. A.; Liu, F.; Russell, T. P.; Emrick, T. *J. Polym. Sci., Part A Polym. Chem.* 2014. doi: 10.1002/pola.27349.

One shortcoming of current cathode modification layers is their inefficiency of electron transport, which limits their operational thickness to 5 nanometers (nm) or less. Such is the case for insulating and p-type polymers. To circumvent this, interlayers with appreciable electron transport properties are needed to reduce the potential for charge build-up and surface recombination. An ideal cathode modification layer would reduce electrode work function ($\Phi$), have solubility orthogonal to that of the photoactive layer, exhibit good film forming properties (wettability/uniformity), transport electrons selectivity, possess large electron affinity ($E_A$) and exhibit long-term stability. No current interlayers satisfy all of these requirements. Accordingly, there is a continuing need for new interlayer materials to overcome the above-described technical limitations.

BRIEF SUMMARY

One embodiment is a conjugated polymer zwitterion comprising repeating units having the structure (I), (II), or a combination thereof,

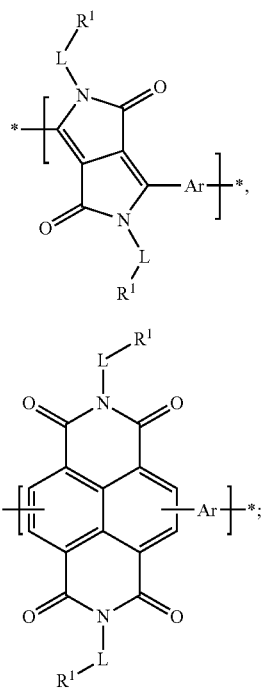

wherein Ar is independently at each occurrence a divalent substituted or unsubstituted $C_{3-30}$ arylene or heteroarylene group; L is independently at each occurrence a divalent $C_{1-16}$ alkylene group, $C_{6-30}$ arylene or heteroarylene group, or alkylene oxide group; and $R^1$ is independently at each occurrence a zwitterion having the structure -A-B-X; wherein A is a center of permanent positive charge or a center of permanent negative charge; B is a divalent group comprising a $C_{1-12}$ alkylene group, a $C_{6-20}$ arylene or heteroarylene group, or an alkylene oxide group; and X is a center of permanent positive charge or a center of permanent negative charge, provided that the zwitterion has an overall net charge of zero.

Another embodiment is a polymer solar cell comprising the conjugated polymer zwitterion.

These and other embodiments are described in detail below.

BRIEF DESCRIPTION OF THE DRAWINGS

The following figures are exemplary embodiments.

DETAILED DESCRIPTION

Figure 1:
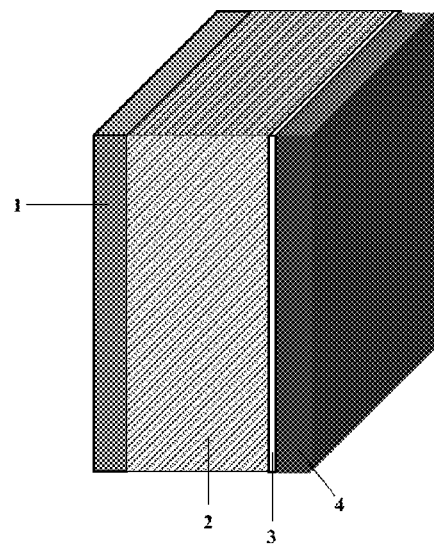
FIG. 1 shows a representative polymer solar cell, where the polymer solar cell includes an anode layer (1), a photoactive layer (2), an interlayer (3), and a metal cathode layer (4).

The inventors hereof have discovered new conjugated polymer zwitterions (CPZs) for use in polymer solar cells. The present inventors have prepared conjugated polymer zwitterions (CPZs) having diketopyrrolopyrrole-(DPP) and naphthalene diimide (NDI) backbones and including pendent zwitterionic groups, for example sulfobetaine groups. Diboronate-ester functionalized bithiophene and benzothiadiazole monomers were copolymerized with the zwitterionic, dibrominated DPP and NDI monomers by A$_2$+B$_2$ Suzuki polymerization. The CPZs can be incorporated into polymer solar cells (PSCs) as interlayers between a photoactive layer and a silver (Ag) cathode. The narrow energy gap DPP- and NDI-containing CPZs unexpectedly yielded PSCs having power conversion efficiencies (PCEs) of 9.49% and 10.19%, respectively. Advantageously, for these high performing polymers, interlayer thickness had only a minor impact on device performance for the DPP- and NDI-CPZs, attributed to their electron transport properties. The present inventors further discovered structure-property relationships that lend insight into the function of CPZ interlayers in PSCs using ultraviolet photoelectron and reflectance spectroscopies, along with external quantum efficiency measurements.

One aspect of the present disclosure is a conjugated polymer zwitterion (CPZ) comprising repeating units having structure (I), structure (II), or a combination thereof,

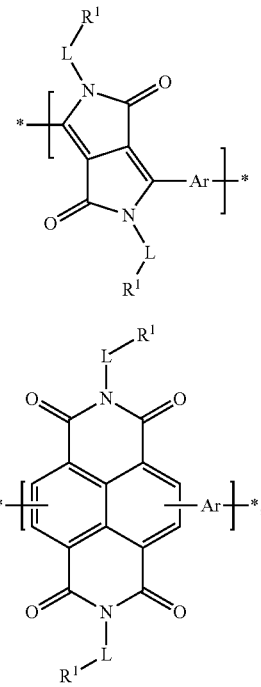

wherein Ar is independently at each occurrence a divalent substituted or unsubstituted $C_{3-30}$ arylene or heteroarylene group, and L is independently at each occurrence a divalent $C_{1-16}$ alkylene group, $C_{6-30}$ arylene or heteroarylene group, or alkylene oxide group. In some embodiments, L is a divalent hexamethylene group (i.e., —$(CH_2)_6$—). As used herein, an alkylene oxide group is a group having the formula —$(R^a$—O$)_n$—$R^b$—, wherein $R^a$ and $R^b$ are independently at each occurrence a $C_{1-6}$ alkylene group, and n is an integer from 1 to 50, for example 1 to 10, for example 1 to 4 (e.g., ethylene oxide, propylene oxide, butylene oxide, poly(ethylene oxide), and the like). $R^1$ is independently at each occurrence a zwitterion having the structure -A-B-X, wherein A is a center of permanent positive charge or a center of permanent negative charge, B is a divalent group comprising a $C_{1-12}$ alkylene group, a $C_{6-30}$ arylene group, or an alkylene oxide group, and X is a center of permanent negative charge or a center of permanent positive charge, provided that the zwitterion has an overall net charge of zero (i.e., the zwitterion is net neutral). For example, in an embodiment wherein A is a center of permanent positive charge, X is a center of permanent negative charge. For example, in an embodiment wherein A is a center of permanent negative charge, X is a center of permanent positive charge. In some embodiments, a center of permanent positive charge can include a quaternary ammonium group, a phosphonium group, a sulfonium group, and the like. In some embodiments, the center of permanent positive charge is preferably an ammonium group. In some embodiments, a center of permanent negative charge can include a sulfonate group, a phosphonate group, a carboxylate group, a thiolate group, and the like.

In some embodiments, each occurrence of $R^1$ can be a sulfobetaine zwitterion, a phosphorylcholine zwitterion, a carboxybetaine zwitterion, a phosphobetaine zwitterion, or a combination thereof. For example, in some embodiments, each occurrence of $R^1$ is a sulfobetaine zwitterion having the structure

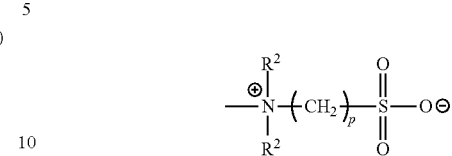

wherein $R^2$ is independently at each occurrence a substituted or unsubstituted $C_{1-12}$ alkyl group and p is independently at each occurrence an integer from 1 to 12. In some embodiments, each occurrence of $R^2$ is methyl. In some embodiments, p is an integer from 1 to 6, for example, in some embodiments p is equal to 3.

As described above, Ar is independently at each occurrence a divalent substituted or unsubstituted $C_{3-30}$ arylene or heteroarylene group. For example, Ar can include a substituted or unsubstituted phenylene group, a phenylene oligomer (e.g., biphenylene, triphenylene, and the like), a naphthalene group, an anthracene group, a pyrene group, a perylene group, a thiophene group, a thiophene oligomer (e.g., bithiophene, terthiophene, and the like), a tellurophene group, a selenophene group, a benzothiadiazole group, a fluorene group, an isoindigo group, a carbazole group, a thienothiophene group, a benzodithiophene group, an indene group, and indenofluorene group, a quinoxaline group, a naphthalene diimide group, a pyrrole group, a diketopyrrolopyrrole group, or a combination thereof. In some embodiments, each of the aforementioned Ar groups can optionally be substituted, for example, with a zwitterionic group as described above, a $C_{1-20}$ alkyl group, a $C_{1-20}$ alkyloxy group, a $C_{1-20}$ perfluoroalkyl group, an alkylene oxide group, or a combination thereof. The term "alkyl" includes branched or straight chain alkyl groups (e.g., methyl, ethyl, n-propyl, n-butyl, n-hexyl, 2-ethylhexyl, 2-hexyldecyl, 2-octyldodecyl, and the like). In some embodiments, Ar is independently at each occurrence

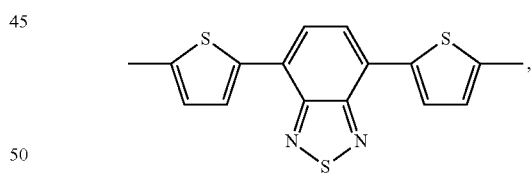

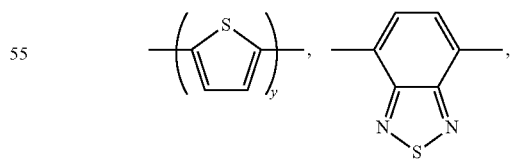

or a combination thereof, wherein y is 1, 2, 3, or 4.

The conjugated polymer zwitterion can have a number average molecular weight of 1,000 to 100,000 Daltons (Da), for example 10,000 to 75,000 Da, for example 10,000 to 50,000 Da, for example 15,000 to 45,000 Da, for example 20,000 to 40,000 Da.

In some embodiments, the conjugated polymer zwitterion is a copolymer. For example, the conjugated polymer zwitterion can further comprise repeating units different from the repeating units having structure (I) or structure (II). In some embodiments, the conjugated polymer zwitterion can further comprise repeating units derived from thiophene, benzothiadiazole, fluorene, isoindigo, benzene, carbazole, thienothiophene, benzodithiophene, quinoxaline, or a combination thereof. Any of the aforementioned comonomers can be substituted or unsubstituted, for example, with a zwitterionic group as described above, a $C_{1-20}$ alkyl group, a $C_{1-20}$ alkyloxy group, a $C_{1-20}$ perfluoroalkyl group, an alkylene oxide group, or a combination thereof. As described above, an alkyl group can be a branched or straight chain alkyl group.

In an embodiment, the conjugated polymer zwitterion comprises repeating units having structure (I)

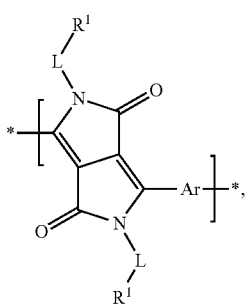
(I)

wherein each occurrence of L is a divalent hexamethylene group, each occurrence of Ar is a divalent heteroarylene group having the structure

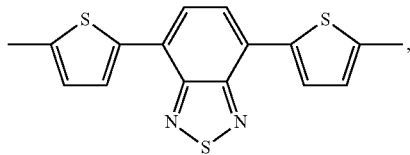

and each occurrence of $R^1$ is a sulfobetaine zwitterion having the structure

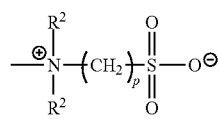

wherein each occurrence of $R^2$ is methyl, and p is equal to 3, and wherein the conjugated polymer zwitterion has a number average molecular weight of 10,000 to 50,000 Da.

In an embodiment, the conjugated polymer zwitterion comprises repeating units having structure (II)

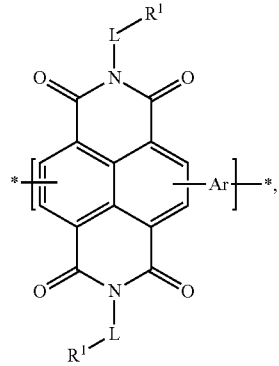
(II)

wherein each occurrence of L is a divalent hexamethylene group, each occurrence of Ar is a divalent heteroarylene group having the structure

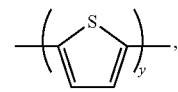

wherein y is 2, and each occurrence of $R^1$ is a sulfobetaine zwitterion having the structure

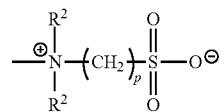

wherein each occurrence of $R^2$ is methyl and p is equal to 3, and wherein the conjugated polymer zwitterion has a number average molecular weight of 10,000 to 50,000 Da.

The conjugated polymer zwitterions of the present disclosure can be useful in applications including, but not limited to, polymer solar cells, light emitting diodes, and field effect transistors. The conjugated polymer zwitterions of the present disclosure can be particularly useful in polymer solar cells. Thus, another aspect of the invention is a polymer solar cell comprising the above-described conjugated polymer zwitterion. The solar cell can be, for example, a bulk heterojunction solar cell, an inverted solar cell, a bilayer solar cell, or a tandem solar cell.

In some embodiments, the polymer solar cell is a bulk heterojunction solar cell generally having the configuration shown in FIG. 1. FIG. 1 shows a cross-sectional view of a typical heterojunction solar cell. For example, the polymer solar cell can comprise an anode substrate (1), a photoactive layer (2), a metal cathode layer (4), and an interlayer (3) disposed between the photoactive active layer and the metal cathode layer. In some embodiments, the interlayer comprises the above-described conjugated polymer zwitterion. In general, one of the anode or cathode is transparent.

The interlayer (3) comprising the conjugated polymer zwitterion can have a thickness of 1 to 100 nanometers, for example 1 to 50 nanometers, for example 1 to 25 nanometers, for example 5 to 25 nanometers, for example 5 to 10 nanometers.

In some embodiments, the anode substrate (1) can comprise any suitable high work function metal. For example, the anode substrate can comprise indium tin oxide. In some embodiments, the anode substrate is an indium tin oxide glass substrate. In some embodiments, the anode substrate is at least partially transparent to light such that the solar cell can receive light from any suitable source of solar energy, for example, the sun. In some embodiments, the polymer solar cell further comprises a hole transport layer. The hole transport layer can be disposed between the anode substrate and the photoactive layer. The hole transport layer can comprise, for example, poly(ethylenedioxythiophene) and polystyrene sulfonate (PEDOT:PSS). In some embodiments, a hole transport layer can comprise the conjugated polymer zwitterion of the interlayer, provided that the donor/acceptor pair has appropriate energy levels. In some embodiments, the hole transport layer can have a thickness of 30 to 200 nm.

The photoactive layer (2) is disposed on the anode substrate, or, when a hole transport layer is present, the photoactive layer is disposed on the hole transport layer. In some embodiments, the photoactive layer comprises a combination of at least one electron-donating material, for example a conjugated polymer or any other suitable electron-donating organic molecule, and at least one electron-accepting material, for example a fullerene (or fullerene derivative) or any other suitable electron-accepting organic molecule.

The electron-donating material can comprise poly(3-hexylthiophene) (P3HT), poly(p-phenylenevinylene) (PPV), poly[2-methoxy-5-(3,7-dimethyloctyloxy)-1,4-phenylene vinylene] (MDMO-PPV), poly(2-methoxy-5-(2'-ethylhexyloxy)-1,4-phenylene vinylene) (MEH-PPV), poly(2,7-(9-(2'-ethylhexyl)-9-hexyl-fluorene)-alt-5,5-(4',7'-di-2-thienyl-2',1',3'-benzothiadiazole)) (PFDTBT), poly(2,6-(4,4-bis-(2-ethylhexyl)-4H-cyclopenta(2,1-b;3,4-b') dithiophene)-alt-4,7-(2,1,3-benzothiadiazole)) (PCPDTBT), poly(p-phenylene-ethynylene)-alt-poly(p-phenylene-vinylene) (PPE-PPV), poly((2,7-(9-(2'-ethylhexyl)-9-hexyl-fluorene)-alt-5,5-(4',7'-di-2-thienyl-2',1',3'-benzothiadiazole))-co-(2,7-(9-(2'-ethylhexyl)-9-hexyl-fluorene)-alt-2,5-thiophene)) (APFO-5), poly(4,8-bis-alkyloxybenzo(1,2-b:4,5-b')dithiophene-2,6-diyl-alt-(alkylthieno(3,4-b)thiophene-2-(2-ethyl-1-hexanone)-2,6-diyl)) (PBDTTT-C), poly(4,8-bis-alkyloxybenzo(1,2-b:4,5-b')dithiophene-2,6-diyl-alt-(thieno(3,4-b)thiophene-2-carboxylate)-2,6-diyl] (PBDTTT-E); poly(N-9'-heptadecanyl-2,7-carbazole-alt-5,5-(4',7'-di-2-thienyl-2',1',3'-benzothiadiazole)) (PCDTBT), poly[4,8-bis[(2-ethylhexyl) oxy]benzo[1,2-b:4,5-b']dithiophene-2,6-diyl][3-fluoro-2-[(2-ethylhexyl)carbonyl] ' thieno [3,4-b]thiophenediyl] (PTB7), poly [(4,4'-bis(2-ethylhexyl) dithienol [3,2-b:2',3'-d]silole)-2,6-diyl-alt-(2,1,3-benzothiadiazole)-4, 7-diyl] (PSBTBT), or a combination thereof.

The electron-accepting material can be, for example, fullerene (e.g., $C_{60}$, $C_{70}$, $C_{76}$, $C_{78}$, $C_{82}$, $C_{84}$, $C_{92}$, and the like), a fullerene derivative (e.g., PCBM, and the like), or a combination thereof. In some embodiments, the electron-accepting material comprises (6,6)-phenyl-$C_{71}$ butyric acid methyl ester (PC$_{71}$BM), (6,6)-phenyl-$C_{61}$ butyric acid methyl ester (PC$_{61}$BM), or a combination thereof.

In some embodiments, the photoactive layer includes the electron-donating material and the electron accepting material in a weight ratio of 1:0.5 to 1:4, for example 1:1 to 1:2.

In some embodiments, the photoactive layer comprises poly(4,8-bis-alkyloxybenzo(1,2-b:4,5-b')dithiophene-2,6-diyl-alt-(alkylthieno(3,4-b)thiophene-2-(2-ethyl-1-hexanone)-2,6-diyl) and (6,6)-phenyl-$C_{71}$ butyric acid methyl ester. In some embodiments, the photoactive layer can have a thickness of 50 to 500 nm, preferably about 100 nm.

The cathode can be, for example, calcium (Ca), aluminum (Al), Magnesium (Mg), titanium (Ti), tungsten (W), silver (Ag), gold (Au), platinum (Pt), indium (In), tin (Sn), gallium (Ga) and the like, or alloys or oxides of these metals. In some embodiments, the metal cathode comprises silver. In some embodiments, the metal cathode layer can have a thickness of 10 to 250 nm.

In an embodiment, the polymer solar cell can include an anode substrate comprising indium tin oxide, a photoactive layer comprising poly(4,8-bis-alkyloxybenzo(1,2-b:4,5-b') dithiophene-2,6-diyl-alt-(alkylthieno(3,4-b)thiophene-2-(2-ethyl-1-hexanone)-2,6-diyl) and (6,6)-phenyl-$C_{71}$ butyric acid methyl ester, a metal cathode layer comprising silver, and an interlayer comprising a conjugated polymer zwitterion comprising repeating units having the structure (I)

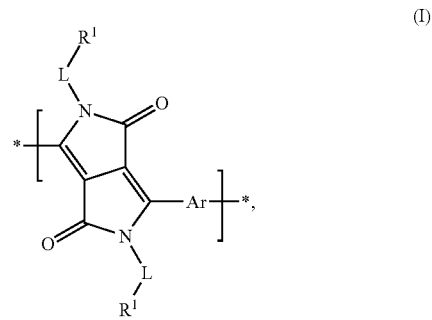

(I)

wherein L, $R^1$, and Ar are as described above.

In an embodiment, the polymer solar cell can include an anode substrate comprising indium tin oxide, a photoactive layer comprising poly(4,8-bis-alkyloxybenzo(1,2-b:4,5-b') dithiophene-2,6-diyl-alt-(alkylthieno(3,4-b)thiophene-2-(2-ethyl-1-hexanone)-2,6-diyl) and (6,6)-phenyl-$C_{71}$ butyric acid methyl ester, a metal cathode layer comprising silver, and an interlayer comprising a conjugated polymer zwitterion comprising repeating units having the structure (II)

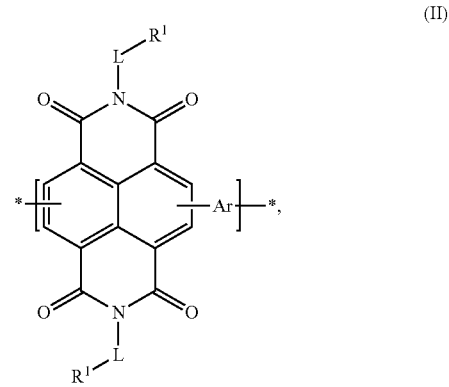

(II)

wherein L, $R^1$, and Ar are as described above.

The polymer solar cells described herein can be prepared by any method that is generally known for preparing a polymer solar cell. For example a solution comprising a hole transport layer material can be coated (e.g., by spin coating) on an anode substrate. A solution comprising a photoactive layer composition can be deposited by spin coating the solution on top of the hole transport layer. Similarly, a solution comprising the conjugated polymer zwitterion can be deposited by spin coating on top of the photoactive layer. The solution casting of the interlayer is preferably carried out using a solvent such that the photoactive layer is not removed during deposition of the interlayer. The metal cathode can be subsequently deposited using thermal evaporation methods. In some embodiments, the metal cathode can alternatively be solution cast, for example from a slurry comprising the metal.

The conjugated polymer zwitterions and polymer solar cells include at least the following embodiments, which are non-limiting.

Embodiment 1: A conjugated polymer zwitterion comprising repeating units having structure (I), (II), or a combination thereof,

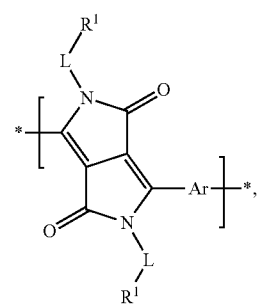

(I)

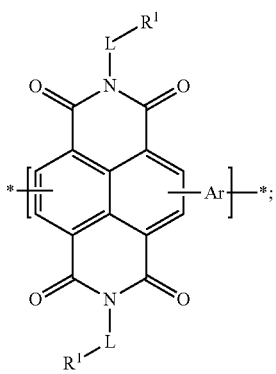

(II)

wherein Ar is independently at each occurrence a divalent substituted or unsubstituted $C_{3-30}$ arylene or heteroarylene group; L is independently at each occurrence a divalent $C_{1-16}$ alkylene group, $C_{6-30}$ arylene or heteroarylene group, or alkylene oxide group; and $R^1$ is independently at each occurrence a zwitterion having the structure -A-B-X; wherein A is a center of permanent positive charge or a center of permanent negative charge; B is a divalent group comprising a $C_{1-12}$ alkylene group, a $C_{6-30}$ arylene or heteroarylene group, or an alkylene oxide group; and X is a center of permanent positive charge or a center of permanent negative charge, provided that the zwitterion has an overall net charge of zero.

Embodiment 2: The conjugated polymer zwitterion of embodiment 1, wherein each occurrence of L is a hexamethylene group.

Embodiment 3: The conjugated polymer zwitterion of embodiment 1 or 2, wherein each occurrence of $R^1$ is a sulfobetaine zwitterion having the structure

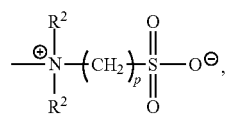

wherein $R^2$ is independently at each occurrence a substituted or unsubstituted $C_{1-12}$ alkyl group; and p is independently at each occurrence an integer from 1 to 12.

Embodiment 4: The conjugated polymer zwitterion of embodiment 3, wherein each occurrence of $R^2$ is methyl; and p is 3.

Embodiment 5: The conjugated polymer zwitterion of any of embodiments 1 to 4, wherein Ar is independently at each occurrence

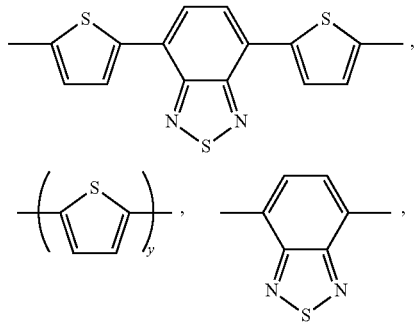

or a combination thereof, wherein y is 1, 2, 3, or 4.

Embodiment 6: The conjugated polymer zwitterion of any of embodiments 1 to 5, wherein the conjugated polymer zwitterion has a number average molecular weight of about 1,000 to about 100,000 Daltons.

Embodiment 7: The conjugated polymer zwitterion of any of embodiments 1 to 6, further comprising repeating units derived from thiophene, benzothiadiazole, fluorene, isoindigo, benzene, carbazole, thienothiophene, benzodithiophene, quinoxaline, or a combination thereof.

Embodiment 8: The conjugated polymer zwitterion of any of embodiments 1 to 7, wherein the conjugated polymer zwitterion comprises repeating units having structure (I)

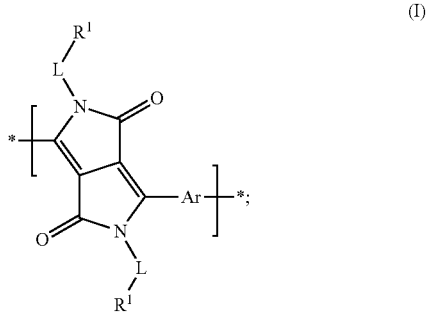

(I)

each occurrence of L is a divalent hexamethylene group; each occurrence of $R^1$ is a sulfobetaine zwitterion having the structure;

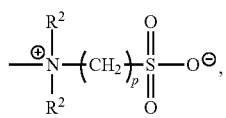

wherein each occurrence of $R^2$ is methyl; and p is 3; each occurrence of Ar is a divalent heteroarylene group having the structure

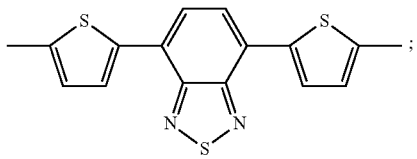

and the conjugated polymer zwitterion has a number average molecular weight of about 10,000 to about 50,000 Daltons.

Embodiment 9: The conjugated polymer zwitterion of any of embodiments 1 to 7, wherein the conjugated polymer zwitterion comprises repeating units having structure (II)

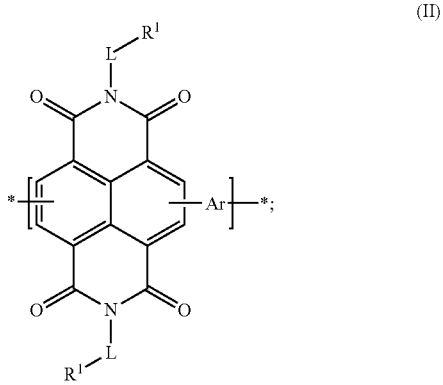

(II)

each occurrence of L is a divalent hexamethylene group; each occurrence of $R^1$ is a sulfobetaine zwitterion having the structure

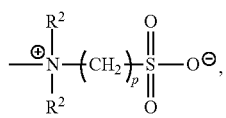

wherein each occurrence of $R^2$ is methyl; and p is 3; and Ar is a divalent heteroarylene group having the structure

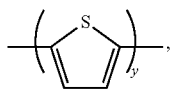

wherein y is 2; and the conjugated polymer zwitterion has a number average molecular weight of about 10,000 to about 50,000 Daltons.

Embodiment 10: A polymer solar cell comprising the conjugated polymer zwitterion of any of embodiments 1 to 9.

Embodiment 11: The polymer solar cell of embodiment 10, comprising an anode substrate; a photoactive layer; a metal cathode layer; and an interlayer disposed between the photoactive layer and the metal cathode layer; wherein the interlayer comprises the conjugated polymer zwitterion of any of embodiments 1 to 9.

Embodiment 12: The polymer solar cell of embodiment 11, wherein the interlayer has a thickness of about 1 to about 100 nanometers.

Embodiment 13: The polymer solar cell of embodiment 11 or 12, wherein the metal cathode layer comprises silver.

Embodiment 14: The polymer solar cell of any of embodiments 11 to 13, wherein the anode substrate comprises indium tin oxide.

Embodiment 15: The polymer solar cell of any of embodiments 11 to 14, wherein the photoactive layer comprises an electron-donating material and an electron-accepting material.

Embodiment 16: The polymer solar cell of embodiment 15, wherein the electron-donating material comprises poly (3-hexylthiophene), poly(p-phenylenevinylene), poly[2-methoxy-5-(3,7-dimethyloctyloxy)-1,4-phenylene vinylene], poly(2-methoxy-5-(2'-ethyl-hexyloxy)-1,4-phenylene vinylene), poly(2,7-(9-(2'-ethylhexyl)-9-hexyl-fluorene)-alt-5,5-(4',7'-di-2-thienyl-2',1',3'-benzothiadiazole)), poly(2,6-(4,4-bis-(2-ethylhexyl)-4H-cyclopenta(2,1-b;3,4-b')dithiophene)-alt-4,7-(2,1,3-benzothiadiazole)), poly(p-phenylene-ethynylene)-alt-poly(p-phenylene-vinylene), poly((2,7-(9-(2'-ethylhexyl)-9-hexyl-fluorene)-alt-5,5-(4',7'-di-2-thienyl-2',1',3'-benzothiadiazole))-co-(2,7-(9-(2'-ethyl-hexyl)-9-hexyl-fluorene)-alt-2,5-thiophene)), poly(4,8-bis-alkyloxybenzo(1,2-b:4,5-b')dithiophene-2,6-diyl-alt-(alkylthieno(3,4-b)thiophene-2-(2-ethyl-1-hexanone)-2,6-diyl)), poly(4,8-bis-alkyloxybenzo(1,2-b:4,5-b') dithiophene-2,6-diyl-alt-(thieno(3,4-b)thiophene-2-carboxylate)-2,6-diyl), poly(N-9'-heptadecanyl-2,7-carbazole-alt-5,5-(4',7'-di-2-thienyl-2',1',3'-benzothiadiazole)), poly[4,8-bis[(2-ethylhexyl) oxy]benzo [1,2-b:4,5-b']dithiophene-2,6-diyl][3-fluoro-2-[(2-ethylhexyl)carbonyl] ' thieno[3,4-b]thiophenediyl], poly [(4, 4'-bis(2-ethylhexyl)dithienol [3,2-b:2',3'-d]silole)-2,6-diyl-alt-(2,1,3-benzothiadiazole)-4, 7-diyl], or a combination thereof; and the electron accepting material comprises (6,6)-phenyl-$C_{71}$ butyric acid methyl ester, (6,6)-phenyl-$C_{61}$ butyric acid methyl ester, or a combination thereof.

Embodiment 17: The polymer solar cell of any of embodiments 11 to 16, further comprising a hole transport layer disposed between the anode substrate and the photoactive layer.

Embodiment 18: The polymer solar cell of embodiment 17, wherein the hole transport layer comprises poly(ethylenedioxythiophene) and polystyrene sulfonate.

Embodiment 19: The polymer solar cell of any of embodiments 11 to 18, wherein the anode substrate comprises indium tin oxide; the photoactive layer comprises poly(4,8-bis-alkyloxybenzo(1,2-b:4,5-b')dithiophene-2,6-diyl-alt-(alkylthieno(3,4-b)thiophene-2-(2-ethyl-1-hexanone)-2,6-diyl) and (6,6)-phenyl-$C_{71}$ butyric acid methyl ester; the cathode metal layer comprises silver; and the interlayer comprises the conjugated polymer zwitterion comprising repeating units having the structure (I)

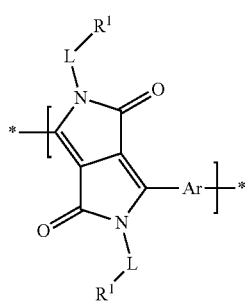

(I)

Embodiment 20: The polymer solar cell of any of embodiments 11 to 18, wherein the anode substrate comprises indium tin oxide; the photoactive layer comprises poly(4,8-bis-alkyloxybenzo(1,2-b:4,5-b')dithiophene-2,6-diyl-alt-(alkylthieno(3,4-b)thiophene-2-(2-ethyl-1-hexanone)-2,6-diyl) and (6,6)-phenyl-$C_{71}$ butyric acid methyl ester; the cathode metal layer comprises silver; and the interlayer comprises the conjugated polymer zwitterion comprising repeating units having the structure (II)

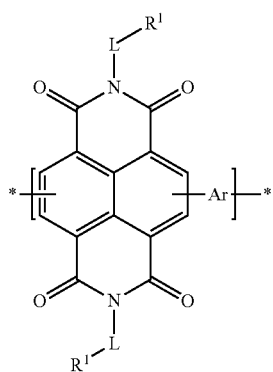

(II)

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

All cited patents, patent applications, and other references are incorporated herein by reference in their entirety, including priority application 62/128,211 filed Mar. 4, 2015. However, if a term in the present application contradicts or conflicts with a term in the incorporated reference, the term from the present application takes precedence over the conflicting term from the incorporated reference All ranges disclosed herein are inclusive of the endpoints, and the endpoints are independently combinable with each other. Each range disclosed herein constitutes a disclosure of any point or sub-range lying within the disclosed range.

The use of the terms "a" and "an" and "the" and similar referents in the context of describing the invention (especially in the context of the following claims) are to be construed to cover both the singular and the plural, unless otherwise indicated herein or clearly contradicted by context. Further, it should be noted that the terms "first," "second," and the like herein do not denote any order, quantity, or importance, but rather are used to distinguish one element from another. The modifier "about" used in connection with a quantity is inclusive of the stated value and has the meaning dictated by the context (e.g., it includes the degree of error associated with measurement of the particular quantity).

As used herein, the term "alkyl" means a branched or straight chain, saturated, monovalent hydrocarbon group, e.g., methyl, ethyl, i-propyl, and n-butyl. "Alkylene" means a straight or branched chain, saturated, divalent hydrocarbon group (e.g., methylene (—$CH_2$—) or propylene (—$(CH_2)_3$—)). "Alkenyl" and "alkenylene" mean a monovalent or divalent, respectively, straight or branched chain hydrocarbon group having at least one carbon-carbon double bond (e.g., ethenyl (—HC=$CH_2$) or propenylene (—HC($CH_3$)=$CH_2$—). "Alkynyl" means a straight or branched chain, monovalent hydrocarbon group having at least one carbon-carbon triple bond (e.g., ethynyl). "Alkoxy" means an alkyl group linked via an oxygen (i.e., alkyl-O—), for example methoxy, ethoxy, and sec-butyloxy. "Cycloalkyl" and "cycloalkylene" mean a monovalent and divalent cyclic hydrocarbon group, respectively, of the formula —$C_nH_{2n-x}$ and —$C_nH_{2n-2x}$— wherein x is the number of cyclization(s). "Aryl" means a monovalent, monocyclic or polycyclic aromatic group (e.g., phenyl or naphthyl). "Arylene" means a divalent, monocyclic or polycyclic aromatic group (e.g., phenylene or naphthylene). The prefix "halo" means a group or compound including one more halogen (F, Cl, Br, or I) substituents, which can be the same or different. The prefix "hetero" means a group or compound that includes at least one ring member that is a heteroatom (e.g., 1, 2, or 3 heteroatoms, wherein each heteroatom is independently N, O, S, or P.

"Substituted" means that the compound or group is substituted with at least one (e.g., 1, 2, 3, or 4) substituents instead of hydrogen, where each substituent is independently nitro (—$NO_2$), cyano (—CN), hydroxy (—OH), halogen, thiol (—SH), thiocyano (—SCN), $C_{1-20}$ alkyl, $C_{2-20}$ alkenyl, $C_{2-20}$ alkynyl, $C_{1-20}$ haloalkyl, $C_{1-20}$ alkoxy, $C_{1-20}$ haloalkoxy, $C_{3-20}$ cycloalkyl, $C_{5-18}$ cycloalkenyl, $C_{6-12}$ aryl, $C_{7-13}$ arylalkylene (e.g, benzyl), $C_{7-12}$ alkylarylene (e.g, toluyl), $C_{4-12}$ heterocycloalkyl, $C_{3-12}$ heteroaryl, $C_{1-6}$ alkyl sulfonyl (—S(=O)$_2$-alkyl), $C_{6-12}$ arylsulfonyl (—S(=O)$_2$-aryl), or tosyl ($CH_3C_6H_4SO_2$—), provided that the substituted atom's normal valence is not exceeded, and that the substitution does not significantly adversely affect the manufacture, stability, or desired property of the compound. When a compound is substituted, the indicated number of carbon atoms is the total number of carbon atoms in the group, including those of the substituent(s).

The conjugated polymer zwitterions and polymer solar cells are further illustrated by the following non-limiting examples.

EXAMPLES

Figure 2:
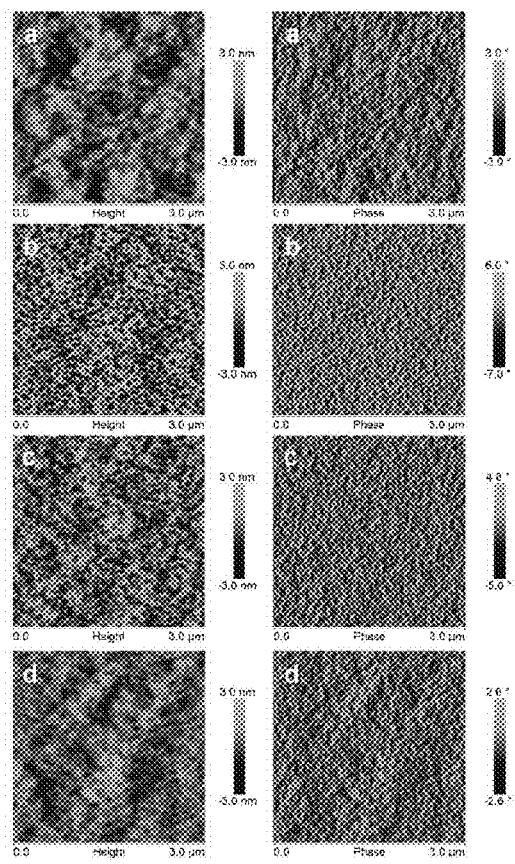
FIG. 2 shows atomic force microscopy (AFM) images of conjugated polymer zwitterions (CPZs) on the photoactive layer, giving average roughness values of 1 nm. (a) No interlayer (bulk heterojunction surface); (b) PT$_3$SB (4.3 nm thick film); (c) PT$_2$BTDPPSB (7.7 nm thick film); (d) PT$_2$NDISB (7.7 nm thick film).

Synthesizing sulfobetaine (SB) functionalized thiophene, diketopyrrolopyrrole (DPP) and naphthalene-diimide (NDI) monomers hinges on incorporating tertiary amines into the polymer, for ring opening of 1,3-propanesultone. As shown in FIG. 2, CPZs were obtained by Suzuki-Miyaura (S-M) coupling of dibrominated SB-monomers with 1) diboronate ester bithiophene for poly(trithiophene sulfobetaine) ($PT_3SB$); 2) poly(bithiophene naphthalene diimide sulfobetaine) (PT$_2$NDISB) and 3) diboronate-ester benzothiadiazole for poly(bithiophene-benzothiadiazole diketopyrrolopyrrole-sulfobetaine) (PT$_2$BTDPPSB). Aqueous tetra-n-butylammonium fluoride (TBAF) served as both base and solvent, and proved crucial for maintaining dissolution of both monomers and growing polymer chains of estimated number-average molecular weight (M$_n$) values 20-40 kDa (determined by size exclusion chromatography in 2,2,2-trifluoroethanol (TFE), relative to PMMA standards). CPZs in this molecular weight range provide smooth and uniform films with an average roughness of about 1 nanometer (nm), as indicated by atomic force microscopy (AFM) of the CPZs on the bulk heterojunction active layer, shown in FIG. 2. The resulting PT$_3$SB was designed to contain a similar density of SB side chains to that of PT$_2$BTDPPSB and PT$_2$NDISB, in an attempt to have comparable CPZ-metal interactions that leads to electrode work function modification, while maintaining good solution processability. Push-pull architectures were chosen for the DPP and NDI CPZs to tune their electron affinity and electron transport capabilities, both of interest for their effect on interlayer performance.

Figure 3:
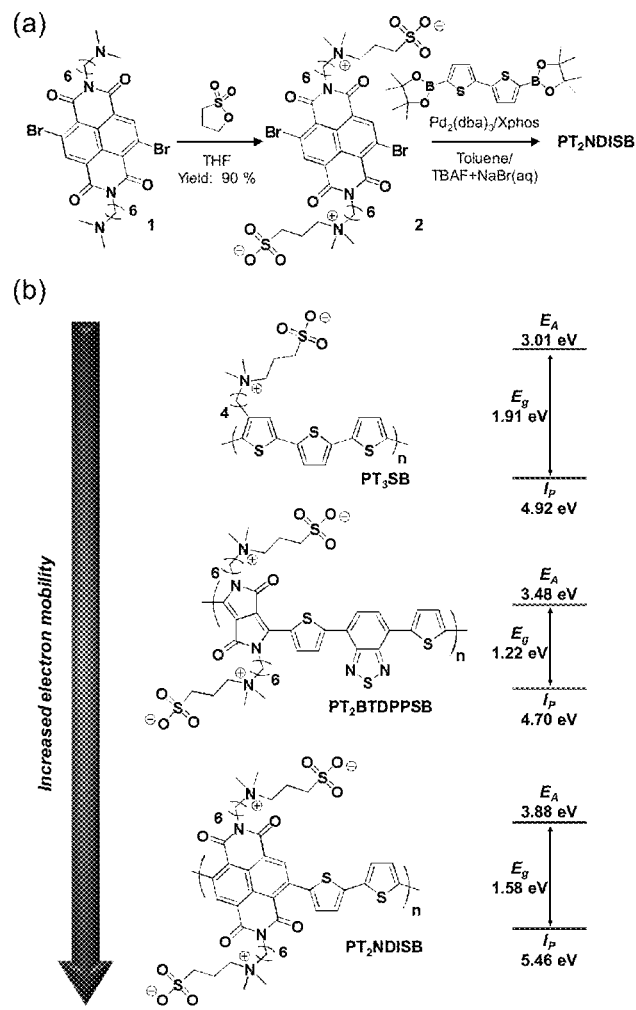
FIG. 3 depicts (a) the synthesis of poly(bithiophene naphthalene diimide sulfobetaine) (PT$_2$NDISB), and (b) the chemical structures and energy levels for the conjugated polyzwitterions poly(trithiophene sulfobetaine) (PT$_3$SB); poly(bithiophene naphthalene diimide sulfobetaine) (PT$_2$NDISB), and poly(bithiophene-benzothiadiazole diketopyrrolopyrrole-sulfobetaine) (PT$_2$BTDPPSB).

Optical energy gap (E$_g$) values were determined for thin films of the CPZs by the onset of absorption where PT$_3$SB had the largest E$_g$ (1.91 eV), PT$_2$BTDPPSB had the smallest E$_g$ (1.22 eV) and PT$_2$NDISB was intermediate (E$_g$=1.58 eV), as shown in FIG. 3. Ionization potential (I$_P$) values were determined for thin films using ultraviolet photoelectron spectroscopy (UPS), and electron affinity (E$_A$) values were taken as the difference between I$_P$ and E$_g$. The large I$_P$ (5.46 eV) and E$_A$ (3.88 eV) values for PT$_2$NDISB make it energetically a better hole-blocking and electron extracting layer, respectively, relative to PT$_3$SB and PT$_2$BTDPPSB. For an interlayer placed between the active layer and cathode, a large E$_A$ is important to minimize the energy barrier of electron transfer from the active layer to the interlayer, which in turn will minimize series resistance (R$_s$) in a device.

Figure 4:
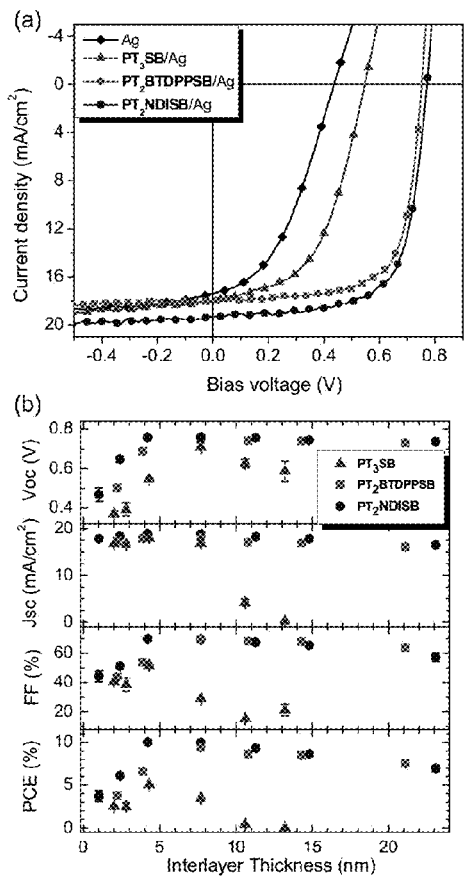
FIG. 4 shows solar cell performance for organic photovoltaic (OPV) devices having the following architecture and composition: indium tin oxide (ITO)/poly(ethylenedioxythiophene):polystyrene sulfonate (PEDOT:PSS)/poly(benzodithiophene-α-thieno[3,4-b]thiophene):[6,6]-phenyl C$_{71}$-butyric acid methyl ester (PBDTT-TT:PC$_{71}$BM)/conjugated polyzwitterion (CPZ)/silver (Ag). (a) J-V curves for OPV devices containing no interlayer (bare Ag) (diamonds) and PT$_3$SB (triangles), PT$_2$BTDPPSB (squares) and PT$_2$NDISB (circles) cathode modification layers with interlayer thickness that provide optimal device power conversion efficiency (PCE). (b) OPV device metrics as a function of interlayer thickness.

OPV devices were fabricated in a standard bulk heterojunction device architecture containing a narrow energy gap donor polymer, poly(benzodithiophene-α-thieno[3,4-b]thiophene) with 2-(ethylhexyl)thienyl side chains (PBDTT-TT), purchased from 1-Material, and [6,6]-phenyl C$_{71}$-butyric acid methyl ester (PC$_{71}$BM) acceptor. An ITO/PEDOT:PSS/PBDTT-TT:PC$_{71}$BM/CPZ/Ag architecture was utilized for all of the PSCs. The CPZ was placed between the active layer and top reflective Ag cathode, selecting Ag in place of the more commonly used Al to highlight the utility of stable high work function metal electrodes when used in conjunction with CPZ interlayers. FIG. 4 provides current density vs. bias voltage (J-V) curves for OPV devices containing no interlayer (bare Ag control) and PT$_3$SB (~5 nm), PT$_2$BTDPPSB (~8 nm) and PT$_2$NDISB (~5 nm) interlayers of optimal thickness. The bare Ag devices gave a maximum PCE of 3.17%, while incorporation of PT$_3$SB, PT$_2$BTDPPSB and PT$_2$NDISB interlayers improved PCE to average/maximum values of 5.08/5.09%, 9.39/9.49% and 9.94/10.19% respectively. These results are provided in Table 1 below.

TABLE 1

|  | Thickness (nm) | V$_{OC}$ (V) | J$_{SC}$ (mA/cm$^2$) | FF (%) | PCE (%) |
|---|---|---|---|---|---|
| PT$_3$SB | 2 | 0.37 ± 0.01 | 16.71 ± 0.27 | 40.78 ± 0.63 | 2.53 ± 0.12 (2.67) |
|  | 2.8 | 0.39 ± 0.03 | 16.63 ± 0.41 | 38.59 ± 4.51 | 2.53 ± 0.40 (3.03) |
|  | 4.3 | 0.55 ± 0.01 | 17.94 ± 0.06 | 51.62 ± 0.37 | 5.08 ± 0.01 (5.09) |
|  | 7.7 | 0.71 ± 0.01 | 16.92 ± 0.07 | 28.91 ± 0.45 | 3.46 ± 0.06 (3.54) |
|  | 10.6 | 0.63 ± 0.02 | 4.17 ± 0.70 | 15.41 ± 0.30 | 0.40 ± 0.07 (0.49) |
|  | 13.2 | 0.59 ± 0.05 | 0.19 ± 0.13 | 21.3 ± 3.81 | 0.02 ± 0.02 (0.04) |
| PT$_2$BTDPPSB | 2.2 | 0.50 ± 0.01 | 17.34 ± 0.25 | 43.67 ± 1.13 | 3.80 ± 0.19 (4.05) |
|  | 3.9 | 0.69 ± 0.01 | 17.85 ± 0.29 | 53.74 ± 1.71 | 6.60 ± 0.22 (7.00) |
|  | 7.7 | 0.75 ± 0.01 | 18.12 ± 0.27 | 69.55 ± 0.89 | 9.39 ± 0.11 (9.49) |
|  | 10.8 | 0.74 ± 0.01 | 17.15 ± 0.24 | 68.12 ± 0.36 | 8.65 ± 0.06 (8.73) |
|  | 14.3 | 0.74 ± 0.01 | 16.94 ± 0.22 | 67.74 ± 0.38 | 8.49 ± 0.06 (8.59) |
|  | 21.1 | 0.73 ± 0.01 | 16.09 ± 0.06 | 63.87 ± 2.29 | 7.52 ± 0.32 (7.87) |
| PT$_2$NDISB | 2.4 | 0.65 ± 0.01 | 18.44 ± 0.30 | 51.02 ± 1.39 | 6.10 ± 0.28 (6.56) |
|  | 4.2 | 0.76 ± 0.01 | 18.91 ± 0.07 | 69.73 ± 0.43 | 9.99 ± 0.15 (10.17) |
|  | 7.7 | 0.76 ± 0.01 | 18.84 ± 0.51 | 69.45 ± 0.70 | 9.94 ± 0.27 (10.19) |
|  | 11.3 | 0.76 ± 0.01 | 18.25 ± 0.31 | 67.34 ± 1.11 | 9.29 ± 0.09 (9.43) |
|  | 14.8 | 0.74 ± 0.01 | 17.80 ± 0.16 | 65.35 ± 0.66 | 8.65 ± 0.12 (8.83) |
|  | 23.1 | 0.74 ± 0.01 | 16.49 ± 0.16 | 57.16 ± 2.91 | 6.95 ± 0.37 (7.63) |

This markedly improved device performance stems from the substantial increase in open-circuit voltage (V$_{OC}$) (~0.44 to 0.75 V) and fill factor (FF) (~42 to 70%), as well as short circuit current density (J$_{SC}$) (~17.5 to 19 mA/cm$^2$ for PT$_2$NDISB). The term fill factor (FF), as used herein, refers to the ratio of the maximum power (V$_{mp}$×J$_{mp}$) divided by the short-circuit current density (J$_{sc}$) and open-circuit voltage (V$_{oc}$) displayed among the light current density-voltage (J-V) characteristics of solar cells, which is generally reported as a percentage. The term short circuit current density (J$_{sc}$), as used herein, is the maximum current through the load under short-circuit conditions. The term open circuit voltage (V$_{oc}$), as used herein, is the maximum voltage obtainable at the load under open-circuit conditions. The term power conversion efficiency (PCE), as used herein, is the ratio of the electrical power output to the light power input (P$_{in}$), defined as PCE=V$_{oc}$J$_{sc}$FFP$_{in}^{-1}$, which is generally reported as a percentage.

The effect of CPZ interlayer thickness on device performance was investigated by varying the polymer concentration in TFE from which the materials were spin-coated onto the active layer, yielding thicknesses from nominally 1 nm up to approximately 23 nm, as shown in Table 1 and FIG. 4(b). The performance of OPVs containing PT$_3$SB was found sensitive to interlayer thickness, where an appreciable reduction in PCE was noted for layers exceeding 5 nm due to a large decrease of FF and J$_{SC}$ and a significant decrease of V$_{OC}$. In contrast, both PT$_2$DPPSB and PT$_2$NDISB proved more tolerant to interlayer thickness variations, with V$_{OC}$ (~0.75 V) and FF (~70%) plateauing at 5-10 nm, but maintaining near-maximum values beyond 20 nm. In addition, J$_{SC}$ is not significantly influenced by CPZ interlayer thickness, with values exceeding 16 mA/cm$^2$ across the entire thickness range investigated for PT$_2$DPPSB and PT$_2$NDISB.

Figure 5:
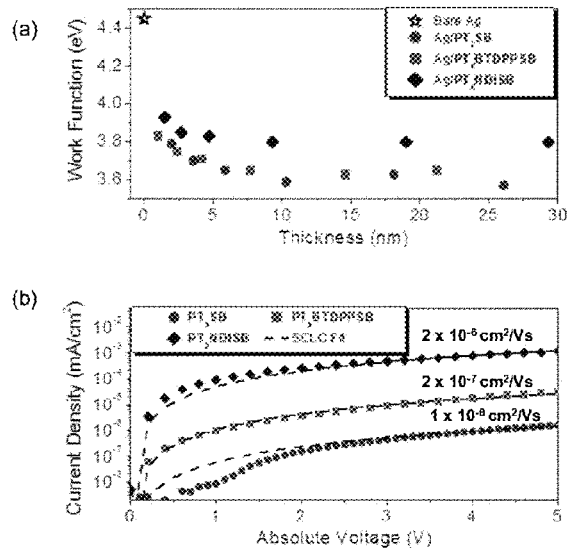
FIG. 5 shows electronic characterization of CPZ films. (a) Effect of CPZ thickness on the work function of Ag; (b) Relative electron mobilities for CPZs estimated using the Mott-Gurney law for the space charge limited current (SCLC) regime for devices with the architecture of ITO/CPZ/Ca/Al.
Figure 6:
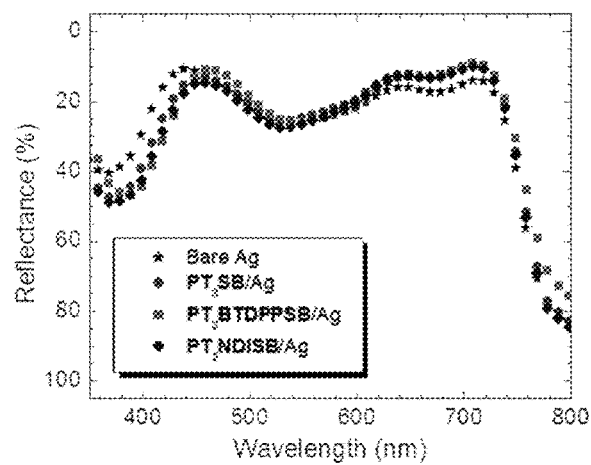
FIG. 6 shows representative reflectance spectra of optimized devices with CPZ interlayers and control device with no interlayer (bare Ag).

The electronics of CPZ films were studied to determine their interaction with Ag using UPS and to estimate their approximate electron mobility by space charge limited current (SCLC) measurements, as shown in FIG. 5. By UPS, the secondary electron cutoff (E$_{SEC}$) in the high binding energy region indicates the effect of CPZs on the work function of Ag, where the difference in E$_{SEC}$ for bare Ag and E$_{SEC}$ for CPZ coated Ag yields Δ values. Ultra-thin (1-2 nm) layers of the CPZs led to an Δ≈−0.5 to −0.6 eV, which corresponds to a reduction in work function from 4.45 eV (native Ag) to approximately 3.9 eV. Upon increasing the thickness of the CPZ layer, the work function was reduced to ~3.8 eV for PT$_2$NDISB and ~3.6 eV for PT$_3$SB and PT$_2$BTDPPSB (FIG. 5(a)), attributed to better film uniformity and reduction in pin holes, and an enhanced image dipole effect. Interlayer thickness correlated to V$_{OC}$ values in the PSCs, where the peak values occurred at about 8 nm interlayer thickness, and, except for PT$_3$SB, remained relatively constant with increasing thickness.

To better understand these findings, electron only devices with an architecture of ITO/CPZ/Ca/Al were fabricated to estimate electron mobility using SCLC and fitting with the Mott-Gurney law, finding 1×10$^{-8}$ cm$^2$/Vs for PT$_3$SB, 2×10$^{-7}$ cm$^2$/Vs for PT$_2$BTDPPSB and 2×10$^{-6}$ cm$^2$/Vs for PT$_2$NDISB (FIG. 5(b)). These values were calculated using dielectric constants (ε) of ~5, as determined by impedance spectroscopy. The higher electron mobility of PT2BTDPPSB and PT2NDISB explain their superior performance with increasing interlayer thickness, as these interlayers are less prone to charge accumulation at the active-layer/CPZ interface which would lead to series resistance and reduced V$_{OC}$ (FIG. 4(a)). The small E$_A$ for PT$_3$SB may contribute to its inferior performance relative to the other structures. For PT$_2$BTDPPSB and PT$_2$NDISB, the relatively constant FF for interlayer thickness exceeding 5 nm suggests that electron transport is not significantly impeded, irrespective of the difference in electron mobility estimated for those two CPZs.

Figure 7:
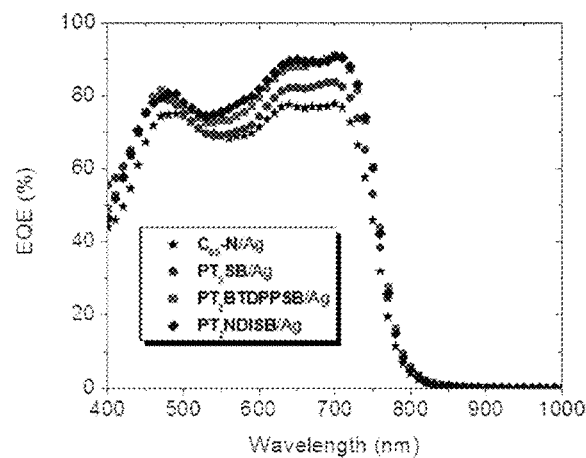
FIG. 7 shows external quantum efficiency (EQE) spectra of optimized OPV devices containing CPZ interlayers compared to no interlayer (bare Ag control).

Optical characterization was carried out to determine the origin of J$_{SC}$ enhancement for OPV devices containing CPZ interlayers. Reflectance spectroscopy of OPV devices containing a 4-8 nm CPZ interlayer was compared to devices with no interlayer as a control. This revealed a 4% decrease in reflectance from ~650-700 nm, corresponding to enhanced absorption over those wavelengths for devices with the CPZ interlayers (FIG. 7). External quantum efficiency (EQE) measurements show larger photocurrent collection in the region where PBDTT-TT absorbs (~600-740 nm) for devices containing CPZ interlayers relative to devices with no interlayer (bare Ag control), directly correlating to the larger J$_{SC}$ (FIG. 7). The intrinsic absorption of the CPZ interlayers does not directly contribute to the reflectance spectra or EQE, thus the CPZs appear to mainly act as optical spacers, redistributing the optical field within the device to enhance absorption in the active layer from ~600-740 nm, rather than contributing by other means, such as through their own absorption or additional charge generation.

In summary, new CPZs were synthesized and incorporated into PSCs as cathode modification layers, enhancing optimized PCE values from 3.17% for devices containing no interfacial layer (bare Ag cathode) to 5.09%, 9.49% and 10.19% for devices containing PT$_3$SB, PT$_2$BTDPPSB and PT$_2$NDISB interfacial layers, respectively. The dramatic improvement in device performance for the DPP and NDI-based interlayers stems from a combination of their ability to effectively lower the work function of Ag, increase the built-in electrostatic device potential, and maintain a low series resistance due to more efficient electron transport across the interlayer. All three CPZs acted as optical spacers to enhance the total photocurrent generated within the active layer. The poor electron transport properties of PT$_3$SB are suggested to negatively affect device performance through interfacial charge build-up, leading to a lower PCE with interlayer thickness. In contrast, both PT$_2$DPPSB and PT$_2$NDISB show no evidence that would reflect charge build-up at the cathode/active layer interface, and maintain high PCE values for interlayer thickness exceeding 20 nm.

Experimental details follow.

Materials. 2,5-Dibromothiophene-butamethylene-sulfobetaine according to literature procedures. See, Page Z. A., Duzhko V V., Emrick T. (2013) *Macromolecules* 46(2):344-351. Diboronate-ester bithiophene monomer was synthesized according to literature procedures. See, Usta H., Lu G, Facchetti A, Marks T J. (2006) *J. Am. Chem. Soc.* 128(28): 9034-9035. 2,6-Dibromonaphthalene bisanhydride was synthesized according to a published procedure. See Guo X, Watson M D. (2008) *Org. Lett.* 10(23):5333-5336. Tetra-n-butylammonium fluoride (TBAF) (75 wt. % in H$_2$O), Aliquat 336, 1,3-propanesultone (99%) and 1,8-diiodooctane (98%) were purchased from Sigma Aldrich and used without further purification. Tris(dibenzylideneacetone)-dipalladium (0) (Pd$_2$(dba)$_3$) (99%), 2-(dicyclohexylphosphino)-2',4',6'-tri-iso-propyl-1,1'-biphenyl (XPhos) (98%), bis(tir-ortho-tolylphosphine)palladium(0) (98%) were purchased from Strem Inc. 6-(Dimethylamino)hexylamine (97%) was purchased from Matrix Scientific and used without further purification. Chloroform-D (99.8%) and 2,2,2-trifluoretha-nol-D$_3$ (99%) were purchased from Cambridge Isotope Laboratories. 2,2,2-Trifluoroethanol (99+%) was purchased from Alfa Aesar, silica gel (200×400 mesh) from Sorbent Technologies, Sephadex LH-20 from GE Healthcare Life Sciences and Spectra/Por dialysis tubing from Spectrum Labs. 5-Bisthiopheneboronic acid pinacol ester (98%, Combi-Blocks) was purified by column chromatography on silica gel, and 2,1,3-benzothiadiazole-4,7-diboronic acid pinacol ester (97%, Combi-Blocks) was sublimed. Tetrahydrofuran (99%, EMD) (THF) was dried over sodium/benzophenone ketyl, and distilled before use. Anhydrous magnesium sulfate, sodium carbonate, glacial acetic acid, hexanes, chloroform, methanol, acetone, diethyl ether and dichloromethane were purchased from Fisher Scientific. Poly(benzodithiophene-α-thieno[3,4-b]thiophene) with 2-(ethylhexyl)thienyl side chains (PBDTT-TT) was purchased from 1-Material, and [6,6]-phenyl C$_{71}$-butyric acid methyl ester (PC$_{71}$BM) was purchased from Nano-C.

Characterization. Proton nuclear magnetic resonance ($^1$H-NMR) spectra were recorded at 300 megahertz (MHz) on a Brüker-spectrospin, and $^{13}$C-NMR spectra were obtained at 100 MHz on a Brüker-spectrospin or 176 MHz on an Agilent Technologies Varian. Centrifugation employed an eppendorf centrifuge 5804 and lyophilization used a Labconco FreeZone® 4.5 Liter Freeze Dry System (model 77500). UV/Vis absorbance measurements were recorded on a Perkin-Elmer Lambda 25 UV/Vis spectrometer. UPS measurements were performed on the Omicron Nanotechnology Model ESCA+S with a helium discharge lamp (He I line, 21.2 eV) as the UV excitation source and a hemispherical SPHERA energy analyzer. All samples were negatively biased by −3 V to compensate for the instrument work function difference repelling the low-kinetic energy electrons. The energy scale of experimental graphs was shifted by 3 eV. Polymer film thickness was determined using the surface profiler KLA Tencor (model Alpha-Step IQ). Matrix assisted laser desorption ionization time of flight (MALDI-TOF) data were obtained on a Brüker microflex using a microScout Ion Source and linear mode detection. The matrix used was [2-(4-hydroxyphenylazo)-benzoic acid] (HABA) which was dropcast from a 40 mg/mL solution in THF containing approximately 0.1-1 mg/mL of the analyte added to the mixture as a solution in TFE. Molecular weights and dispersities (Đ) were estimated by size exclusion chromatography (SEC) in 2,2,2-trifluoroethanol with 0.02 M sodium trifluoroacetate at 40° C. using an Agilent 1200 system equipped with an Agilent 1200 series isocratic pump operated at 1 mL/min, a degasser, an Agilent 1260 infinity autosampler, a 50×8 mm PSS PFG guard column (Polymer Standards Service), three 300 mm×7.5 mm PSS PFG analytical linear M columns with a 7 μm particle size (Polymer Standards Service), and an Agilent 1200 refractive index detector and Agilent 1200 VWD UV detector, calibrated with poly(methyl methacrylate) standards. Current-voltage (I-V) characteristics were measured in a $N_2$ atmosphere (unless otherwise stated) using a Keithley 2400 sourcemeter under simulated AM1.5G irradiation using a 300 W Xe lamp solar simulator (Newport 91160). The light intensity was adjusted with an National Renewable Energy Laboratory (NREL)-calibrated Si reference solar cell and KG-5 filter. The illuminated area (0.03025 cm$^2$ unless otherwise stated) was defined by a photomask with an aperture, the area of which was measured at NREL, and used in all reported PCE measurements. Impedance spectroscopy was performed on an Agilent Precision Impedance Analyzer (4294A).

OPV Device Fabrication. Photovoltaic devices were fabricated by spin coating poly(ethylenedioxythiophene):poly(styrene sulfonate) (PEDOT:PSS) (H. C. Starck, I 4083) onto pre-cleaned glass substrates (14.7×14.7 mm), patterned with indium tin oxide (ITO) (10Ω/□, from Thin Film Devices, Inc.) to cover half of the substrate area. Then, PEDOT:PSS was baked at 150° C. for 30 minutes in air, and transferred to the glove box ($N_2$ atmosphere, <1 ppm $O_2$, <1 ppm $H_2O$) for deposition of the photoactive layer, interlayer and top electrode. A mixture of PBDTT-TT and $PC_{71}BM$ (1:1.8 weight ratio) in chlorobenzene:1,8-diiodooctane (3.2 v % DIO) was stirred at 55° C. for ~1 day. PBDTT-TT has the structure

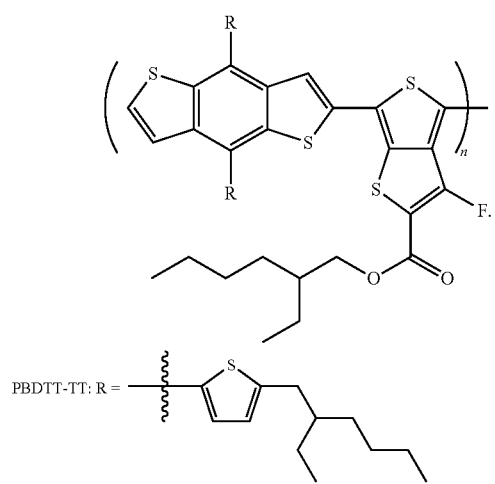

The photoactive layers were deposited by spin-coating the solution onto the PEDOT:PSS layer. The thickness of the active layer film was ~100 nm (determined by profilometry). DIO was removed under vacuum, followed by spin-coating of CPZs from a trifluoroethanol solution. Thermal evaporation of metal electrodes through a shadow mask created four devices on each substrate. Performance characteristics of those devices were averaged. The overlap between the bottom ITO electrode and the top metal electrode defined the maximum available device area of 0.06 cm$^2$.

Figure 8:
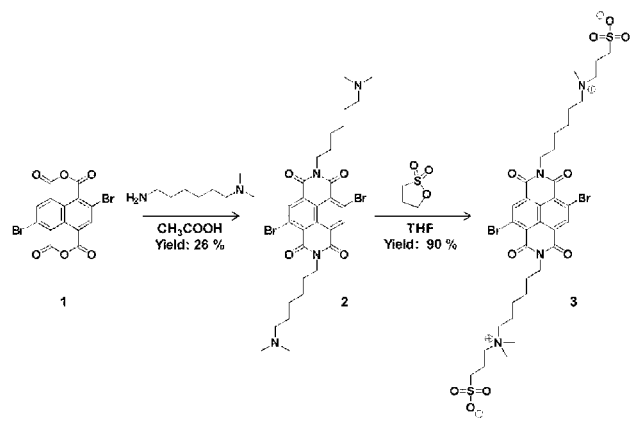
FIG. 8 is a chemical scheme depicting the synthesis of the dibromo-naphthalenediimide sulfobetaine monomer.

Synthesis of 4,9-dibromo-2,7-bis(6-(dimethylamino)hexyl)benzo[lmn][3,8]phenanthroline-1,3,6,8(2H,7H)-tetraone (2). 4,9-Dibromo-2,7-bis(6-(dimethylamino)hexyl)benzo[lmn][3,8]phenanthroline-1,3,6,8(2H,7H)-tetraone (shown as compound 2) was prepared as summarized in the chemical scheme of FIG. 8. A 2-neck, 250 mL round bottom flask equipped with a magnetic stir bar, inlet adapter, condenser and septum was flushed with nitrogen. 2,6-Dibromonaphthalene bisanhydride (shown as compound 1) (3.30 grams, 7.8 millimoles), glacial acetic acid (82 milliliters) and 6-(dimethylamino)hexylamine (3.90 grams, 27.1 millimoles) were added to the flask. The mixture was heated to reflux and stirred for 2 hours. The flask was immersed in an ice bath, and saturated $Na_2CO_3$ (aqueous) was added slowly. The product was extracted into dichloromethane (DCM), washed with saturated $Na_2CO_3$ (aqueous), then brine, dried with anhydrous magnesium sulfate ($MgSO_4$), filtered and concentrated to obtain a red/brown solid. The crude product was purified further using basic alumina (activated Brockman I) eluting with dichloromethane:methanol (DCM:MeOH; 99.5:0.5) yielding a red/yellow solid that was dissolved in DCM and precipitated into acetone to afford a beige solid (0.95 grams, 18%). $^1$H NMR (700 MHz, Chloroform-d) δ 8.93 (s, 2H), 4.16 (t, J=7.8 Hz, 4H), 2.23 (t, J=7.5 Hz, 4H), 2.19 (s, 12H), 1.72 (p, J=7.7 Hz, 4H), 1.48-1.45 (m, 4H), 1.45-1.40 (m, 4H), 1.40-1.36 (m, 4H).$^{13}$C NMR (176 MHz, Chloroform-d) δ 160.64, 160.60, 138.98, 128.27, 127.63, 125.27, 124.00, 59.75, 45.50, 41.48, 27.83, 27.64, 27.13, 27.03. MALDI-TOF (m/z): [M+H]$^+$ calculated for $C_{30}H_{39}Br_2N_4O_4$: 679.12. Found: 678.90.

Synthesis of 3,3'-(((4,9-dibromo-1,3,6,8-tetraoxobenzo[lmn][3,8]phenanthroline-2,7(1H,3H,6H,8H)-diyl)bis(hexane-6,1-diyl))bis(dimethylammonionediyl))bis(propane-1-sulfonate) ($Br_2NDISB$, 3). 3,3'-(((4,9-dibromo-1,3,6,8-tetraoxobenzo[lmn][3,8]phenanthroline-2,7(1H,3H,6H,8H)-diyl)bis(hexane-6,1-diyl))bis(dimethylammonionediyl))bis(propane-1-sulfonate) ($Br_2NDISB$, shown as compound 3) was prepared as summarized in the chemical scheme of FIG. 8. A 2-neck, 250 mL round-bottom flask equipped with a magnetic stir bar, inlet adapter, condenser and septum was flushed with nitrogen, followed by addition of compound 2 (1.1 grams, 1.6 millimoles), 1,3-propanesultone (1.58 grams, 13.0 miilimoles) and anhydrous THF (100 milliliters). The mixture was heated to reflux while stirring for 24 hours, then cooled to room temperature. The product precipitated during the course of the reaction, and was isolated by filtration, then purified by washing with THF to obtain a light orange/yellow solid (1.34 grams, 90%). Further purification was performed by recrystallization from water, yielding pale yellow flakes (1.02 grams, 68%). $^1$H NMR (700 MHz, 2,2,2-Trifluoroethanol-d$_3$) δ 8.87 (d, J=2.6 Hz, 2H), 4.18 (t, J=7.9 Hz, 4H), 3.46-3.40 (m, 4H), 3.29-3.21 (m, 4H), 3.04 (s, 12H), 2.92 (td, J=6.9, 2.6 Hz, 4H), 2.27-2.18 (m, 4H), 1.86-1.74 (m, 8H), 1.59-1.48 (m, 8H). $^{13}$C NMR (176 MHz, 2,2,2-Trifluoroethanol-d$_3$) δ 163.65, 163.41, 140.79, 130.04, 129.56, 126.01, 67.00, 64.96, 52.19, 48.86, 42.92, 28.66, 27.61, 27.05, 23.86, 20.20. MALDI-TOF (m/z): [M+H]$^+$ calculated for $C_{36}H_{51}Br_2N_4O_{10}S_2$: 923.13. Found: 923.30.

Figure 9:
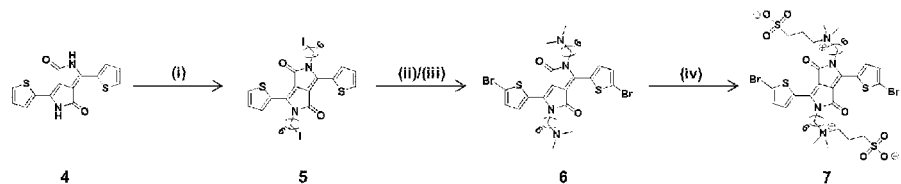
FIG. 9 is a chemical scheme depicting the synthesis of the diketopyrrolopyrrole-sulfobetaine (DPP-SB) monomer. Reaction conditions for each step are as follows: (i) 1,6-diiodohexane, cesium carbonate, N-methylpyrrolidone, 48% yield; (ii) N-bromosuccinimide, chloroform, 70% yield; (iii) dimethylamine, tetrahydrofuran (THF), 76% yield; (iv) 1,3-propanesultone, THF, 92% yield.

Synthesis 2,5-Bis(6-iodohexyl)-3,6-di(thiophen-2-yl)pyrrolo[3,4-c]pyrrole-1,4(2H,5H)-dione (5). 2,5-Bis(6-iodohexyl)-3,6-di(thiophen-2-yl)pyrrolo[3,4-c]pyrrole-1,4(2H, 5H)-dione (shown as compound 5) was prepared as summarized in the chemical scheme of FIG. 9. A 2-neck, 250 mL round-bottom flask equipped with a magnetic stir bar, inlet adapter and septum was flushed with nitrogen. Compound 4 (3.0 grams, 10 millimoles), cesium carbonate (13.0 grams, 40 millimoles) and N-methylpyrrolidone (NMP) (anhydrous, 120 milliliters) were added to the flask. The reaction was heated to 70° C. with stirring, followed by addition of 1,6-diiodohexane (27.0 grams, 13.2 milliliters, 80 millimoles). The reaction was stirred at 70° C. for 4 hours and then cooled to room temperature. The product was extracted with dichloromethane (DCM), the organic fractions combined, washed with water, dried over magnesium sulfate ($MgSO_4$), filtered and concentrated to obtain a red solid. This was purified by column chromatography on silica gel, eluting with DCM:hexanes mixtures. The solvent was removed by rotary evaporation to afford a red solid that was recrystallized from DCM:hexanes (1:5 v/v) to give the desired product as red needles (3.62 grams, 50% yield). $^1$H NMR (300 MHz, Chloroform-d) δ 8.92 (d, J53.9 Hz, 2H), 7.65 (d, J55.0 Hz, 2H), 7.29 (dd, J55.1, 3.9 Hz, 2H), 4.15-4.01 (m, 4H), 3.18 (t, J56.9 Hz, 4H), 1.93-1.66 (m, 8H), 1.51-1.39 (m, 8H). 13C NMR (176 MHz, Chloroform-d) d 161.46, 140.09, 135.47, 130.88, 129.79, 128.82, 107.82, 42.12, 33.43, 30.24, 29.88, 25.94, 6.98.

Synthesis of 3,6-Bis(5-bromothiophen-2-yl)-2,5-bis(6-iodohexyl)pyrrolo[3,4-c]pyrrole-1,4(2H,5H)-dione. A 2-neck, 250 mL round-bottom flask equipped with a magnetic stir bar, inlet adapter and septum was flushed with nitrogen gas. Compound 5 (2.56 grams, 3.55 millimoles) and chloroform ($CHCl_3$) (62 milliliters) were added to the flask. The reaction mixture was protected from light by covering the glassware with aluminum foil, and N-bromosuccinimide (NBS) (1.58 grams, 8.88 millimoles) was added under a stream of nitrogen. The mixture was heated to 35° C. and stirred in the dark for 24 hours, then cooled to room temperature. The product was isolated by precipitation into MeOH, then filtered and washed with MeOH to afford a purple solid (2.43 grams, 78% yield). $^1$H NMR (400 MHz, 98° C., o-dichlorobenzene-d$_4$) δ 8.66 (d, J54.2 Hz, 2H), 7.04 (d, J54.1 Hz, 2H), 3.93 (t, J57.6 Hz, 4H), 2.98 (t, J57.0 Hz, 4H), 1.85-1.48 (m, 8H), 1.43-1.26 (m, 8H). $^{13}$C NMR (101 MHz, 98° C., CDCl$_3$) δ 160.49, 138.29, 134.75, 131.44, 131.33, 118.48, 108.28, 41.81, 33.29, 29.93, 29.64, 25.61, 5.20.

Synthesis of 3,6-Bis(5-bromothiophen-2-yl)-2,5-bis(6-(dimethylamino)hexyl)pyrrolo[3,4-c]pyrrole-1,4(2H,5H)-dione (6). 3,6-Bis(5-bromothiophen-2-yl)-2,5-bis(6-(dimethylamino)hexyl)pyrrolo[3,4-c]pyrrole-1,4(2H,5H)-dione (shown as compound 6) was prepared according to the chemical scheme of FIG. 9. A 500 mL pressure flask equipped with a magnetic stir bar was flushed with nitrogen, followed by addition of 3,6-bis(5-bromothiophen-2-yl)-2,5-bis(6-iodohexyl)pyrrolo[3,4-c]pyrrole-1,4(2H,5H)-dione (3.0 grams, 3.4 millimoles) and dimethylamine (2 M in THF, 250 milliliters). The pressure flask was capped tightly and heated to 60° C. for 1 hour with stirring. The mixture was cooled to room temperature, water was added and the product was extracted with DCM. The organic fractions were combined and dried over $MgSO_4$, filtered and concentrated. The crude product was purified by column chromatography on silica gel, eluting with DCM:MeOH:TEA mixtures. The solvent was removed under reduced pressure, giving a purple/red solid that was purified further by recrystallization from acetone to give the desired product as a purple/red solid (1.82 grams, 75% yield). $^1$H NMR (300 MHz, methylene chloride-d$_2$) δ 8.66 (d, J54.2 Hz, 2H), 7.27 (d, J54.2 Hz, 2H), 3.97 (t, J57.6 Hz, 4H), 2.30-2.22 (m, 4H), 2.18 (s, 12H), 1.80-1.62 (m, 4H), 1.56-1.29 (m, 12H). $^{13}$C NMR (176 MHz, chloroform-d) δ 161.17, 139.12, 135.52, 131.82, 131.20, 119.32, 107.96, 59.79, 45.54, 42.32, 30.11, 27.58, 27.21, 26.92.

Synthesis of 3,3'-(((3,6-Bis(5-bromothiophen-2-yl)-1,4-dioxopyrrolo[3,4-c]pyrrole-2,5(1H,4H)-diyl)bis(hexane-6,1-diyl))bis(dimethylammonionediyl))bis(propane-1-sulfonate) (7). 3,3'-(((3,6-Bis(5-bromothiophen-2-yl)-1,4-dioxopyrrolo[3,4-c]pyrrole-2,5(1H,4H)-diyl)bis(hexane-6,1-diyl))bis(dimethylammonionediyl))bis(propane-1-sulfonate) (shown as compound 7) was prepared according to the chemical scheme of FIG. 9. A 2-neck, 250 mL round-bottom flask equipped with a magnetic stir bar, inlet adapter, condenser, and septum was flushed with nitrogen. Compound 6 (1.75 grams, 2.46 millimoles), 1,3-propanesultone (2.40 grams, 19.65 millimoles), and THF (anhydrous, 175 milliliters) were added to the flask. The reaction was heated to reflux while stirring for 24 hours and then cooled to room temperature. The product precipitated during the course of the reaction and was obtained by filtration and purified by washing with THF. Further purification was done by recrystallizing the product from water, yielding lustrous gold/purple flakes (2.21 grams, 94%). $^1$H NMR (300 MHz, TFE-d$_3$) δ 8.36 (d, J53.7 Hz, 2H), 7.23 (d, J53.8 Hz, 2H), 3.95 (s, 4H), 3.46-3.33 (m, 4H), 3.27-3.15 (m, 4H), 3.00 (s, 12H), 2.91 (t, J56.1 Hz, 4H), 2.37-2.03 (m, 4H), 1.83-1.60 (m, 8H), 1.55-1.33 (m, 8H). $^{13}$C NMR (176 MHz, TFE-d$_3$) δ 163.84, 141.96, 137.15, 133.56, 132.52, 122.32, 109.66, 69.70, 67.01, 64.97, 52.13, 48.84, 30.88, 27.56, 27.20, 24.02, 20.18. MALDI-TOF (m/z): [M+H]$^+$ calculated for $C_{36}H_{53}Br_2N_4O_8S_4$: 957.10. Found: 957.31.

Figure 10:
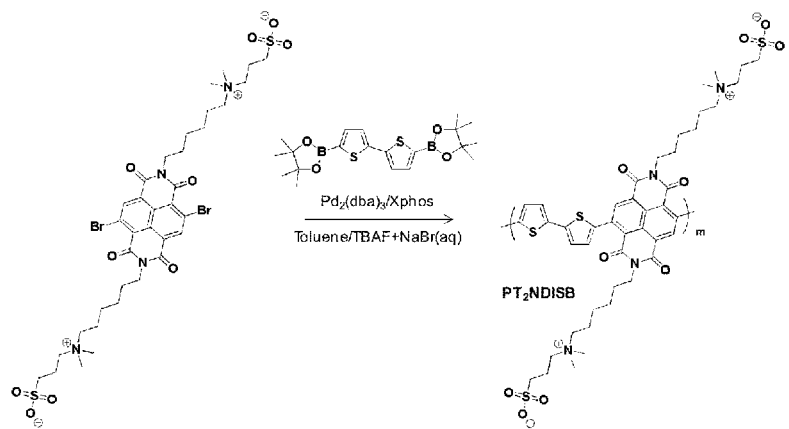
FIG. 10 is a chemical scheme depicting the synthesis of poly(naphthalene diimide-sulfobetaine) (PT$_2$NDISB) with Suzuki coupling. The syntheses of poly(thiophene-sulfobetaine) (PT$_3$SB) and poly(diketopyrrolopyrrole-sulfobetaine) (PT$_2$BTDPPSB) followed an analogous procedure, except using diboronate-ester benzothiadiazole in place of diboronate-ester bithiophene for PT$_2$BTDPPSB.

General procedure for CPZ synthesis. A 20 milliliter, thick-walled glass pressure tube equipped with a magnetic stir bar was transferred to a nitrogen-filled glove box. Tris(dibenzylideneacetone)-dipalladium(0) ($Pd_2(dba)_3$) (6.9 milligrams, 0.0075 millimoles) and 2-(dicyclohexylphosphino)-2',4',6'-tri-isopropyl-1,1'-biphenyl (XPhos) (10.7 milligrams, 0.0225 millimoles) were added to the tube, followed by capping the tube and removing it from the glove-box. The dibromo and diboronate-ester monomers (0.375 millimoles of each), AQ336 (6 drops), toluene (6 milliliters), tetra-n-butylammonium fluoride solution (75 wt. % in H$_2$O, 2.2 milliliters) and NaBr (2 M aq, 0.8 milliliters) were added to the tube and degassed with argon for 5 minutes. The pressure tube was capped securely and the mixture stirred vigorously at 110° C. in the absence of light for 24 hours. The polymerization mixture was cooled to room temperature, and precipitated into MeOH. The polymer was isolated by centrifugation and extracted first with MeOH for 16 hours then with 2,2,2-trifluoroethanol (TFE) for 4 hours using a Soxhlet apparatus. The TFE solution containing polymer was passed through a plug of Sephadex LH-20, then added to a dialysis membrane (10 kDa cutoff) and dialyzed in a 4 liter beaker against water for 24 hours. The contents of the dialysis bag were lyophilized to afford the polymer as a colored fluffy solid. An exemplary CPZ synthesis is shown in the chemical scheme of FIG. 10.

PT$_3$SB was obtained using the above procedure as a deep red-gold solid (164 milligrams, 93%). Number average molecular weight ($M_n$)=21,500-52,900 g/mol, dispersity (Đ)=1.5-2.2; $^1$H NMR (700 MHz, 2,2,2-trifluoroethanol-d$_3$)

δ 7.20-6.60 (br, 5H), 3.42-3.25 (br, 2H), 3.22-3.08 (br, 2H), 3.07-2.57 (br, 10H), 2.20-2.01 (br, 2H), 1.92-1.45 (br, 4H).

PT$_2$BTDPPSB was obtained using the above procedure as a blue-green solid (303 milligrams, 87%). M$_n$=20,300-25,400 g/mol, Đ=1.6-1.7; $^1$H NMR (300 MHz, 2,2,2,-Trifluoroethanol-d$_3$) δ 9.43-8.23 (br, 2H), 8.23-6.74 (br, 4H), 4.32-2.59 (br, m, 28H), 2.58-0.91 (br, m, 20H).

PT$_2$NDISB was obtained as a blue solid (319 milligrams, 92%). M$_n$=11,700-55,800 g/mol, Đ=1.6-4.7; $^1$H NMR (300 MHz, 2,2,2-Trifluoroethanol-d$_3$) δ 9.27-8.23 (br, 2H), 7.34-7.13 (br, 2H), 6.98-6.12 (br, 2H), 4.69-4.03 (br, 4H), 3.43-3.32 (br, 4H), 3.31-3.15 (br, 4H), 3.12-2.83 (br, 16H), 2.28-2.07 (s, 4H), 1.96-1.70 (br, 8H), 1.71-1.38 (br, 8H).

The invention claimed is:

1. A conjugated polymer zwitterion comprising repeating units having structure (I), (II), or a combination thereof,

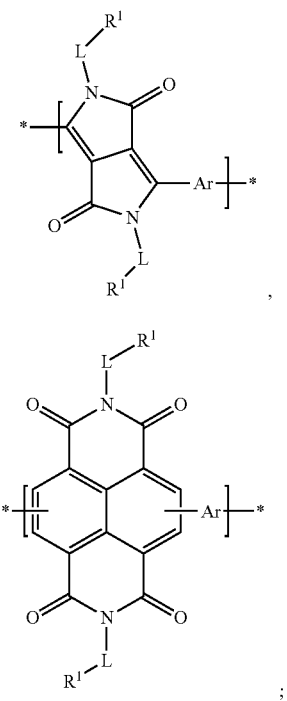

wherein
Ar is independently at each occurrence a divalent substituted or unsubstituted C$_{3-30}$ arylene or heteroarylene group;
L is independently at each occurrence a divalent C$_{1-16}$ alkylene group, C$_{6-30}$ arylene or heteroarylene group, or alkylene oxide group; and
R$^1$ is independently at each occurrence a zwitterion having the structure -A-B-X;
wherein
A is a center of permanent positive charge or a center of permanent negative charge;
B is a divalent group comprising a C$_{1-12}$ alkylene group, a C$_{6-30}$ arylene or heteroarylene group, or an alkylene oxide group; and
X is a center of permanent positive charge or a center of permanent negative charge, provided that the zwitterion has an overall net charge of zero.

2. The conjugated polymer zwitterion of claim 1, wherein each occurrence of L is a hexamethylene group.

3. The conjugated polymer zwitterion of claim 1, wherein each occurrence of R$^1$ is a sulfobetaine zwitterion having the structure

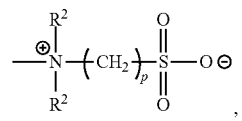

wherein
R$^2$ is independently at each occurrence a substituted or unsubstituted C$_{1-12}$ alkyl group; and
p is independently at each occurrence an integer from 1 to 12.

4. The conjugated polymer zwitterion of claim 3, wherein each occurrence of R$^2$ is methyl; and
p is 3.

5. The conjugated polymer zwitterion of claim 1, wherein Ar is independently at each occurrence

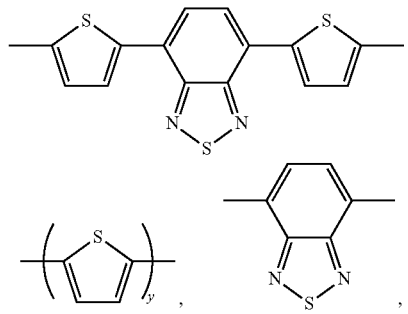

or a combination thereof, wherein y is 1, 2, 3, or 4.

6. The conjugated polymer zwitterion of claim 1, wherein the conjugated polymer zwitterion has a number average molecular weight of about 1,000 to about 100,000 Daltons.

7. The conjugated polymer zwitterion of claim 1, further comprising repeating units derived from thiophene, benzothiadiazole, fluorene, isoindigo, benzene, carbazole, thienothiophene, benzodithiophene, quinoxaline, or a combination thereof.

8. The conjugated polymer zwitterion of claim 1, wherein
the conjugated polymer zwitterion comprises repeating units having structure (I)

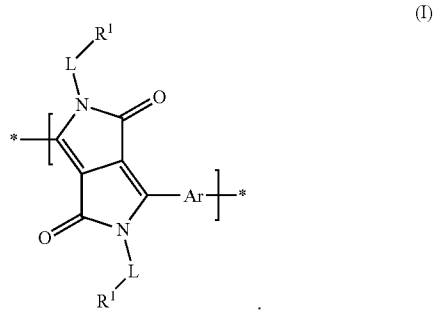

each occurrence of L is a divalent hexamethylene group;

each occurrence of $R^1$ is a sulfobetaine zwitterion having the structure

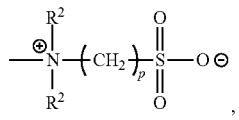

wherein
each occurrence of $R^2$ is methyl; and
p is 3;
each occurrence of Ar is a divalent heteroarylene group having the structure

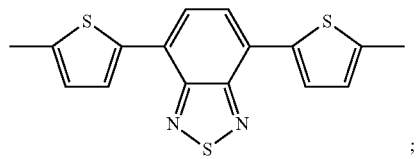

and
the conjugated polymer zwitterion has a number average molecular weight of about 10,000 to about 50,000 Daltons.

9. The conjugated polymer zwitterion of claim 1, wherein
the conjugated polymer zwitterion comprises repeating units having structure (II)

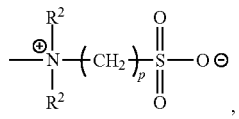
(II)

each occurrence of L is a divalent hexamethylene group;
each occurrence of $R^1$ is a sulfobetaine zwitterion having the structure

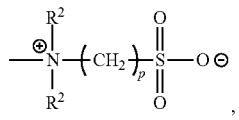

wherein
each occurrence of $R^2$ is methyl; and
p is 3; and
Ar is a divalent heteroarylene group having the structure

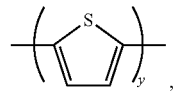

wherein y is 2; and
the conjugated polymer zwitterion has a number average molecular weight of about 10,000 to about 50,000 Daltons.

10. A polymer solar cell comprising the conjugated polymer zwitterion of claim 1.

11. The polymer solar cell of claim 10, comprising
an anode substrate;
a photoactive layer;
a metal cathode layer; and
an interlayer disposed between the photoactive layer and the metal cathode layer;
wherein the interlayer comprises the conjugated polymer zwitterion of claim 1.

12. The polymer solar cell of claim 11, wherein the interlayer has a thickness of about 1 to about 100 nanometers.

13. The polymer solar cell of claim 11, wherein the metal cathode layer comprises silver.

14. The polymer solar cell of claim 11, wherein the anode substrate comprises indium tin oxide.

15. The polymer solar cell of claim 11, wherein the photoactive layer comprises an electron-donating material and an electron-accepting material.

16. The polymer solar cell of claim 15, wherein
the electron-donating material comprises poly(3-hexylthiophene), poly(p-phenylenevinylene), poly[2-methoxy-5-(3,7-dimethyloctyloxy)-1,4-phenylene vinylene], poly(2-methoxy-5-(2'-ethyl-hexyloxy)-1,4-phenylene vinylene), poly(2,7-(9-(2'-ethylhexyl)-9-hexyl-fluorene)-alt-5,5-(4',7'-di-2-thienyl-2',1',3'-benzothiadiazole)), poly(2,6-(4,4-bis-(2-ethylhexyl)-4H-cyclopenta(2,1-b;3,4-b')dithiophene)-alt-4,7-(2,1,3-benzothiadiazole)), poly(p-phenylene-ethynylene)-alt-poly(p-phenylene-vinylene), poly((2,7-(9-(2'-ethylhexyl)-9-hexyl-fluorene)-alt-5,5-(4',7'-di-2-thienyl-2',1',3'-benzothiadiazole))-co-(2,7-(9-(2'-ethylhexyl)-9-hexyl-fluorene)-alt-2,5-thiophene)), poly(4,8-bis-alkyloxybenzo(1,2-b:4,5-b')dithiophene-2,6-diyl-alt-(alkylthieno(3,4-b)thiophene-2-(2-ethyl-1-hexanone)-2,6-diyl)), poly(4,8-bis-alkyloxybenzo(1,2-b:4,5-b')dithiophene-2,6-diyl-alt-(thieno(3,4-b) thiophene-2-carboxylate)-2,6-diyl), poly(N-9'-heptadecanyl-2,7-carbazole-alt-5,5-(4',7'-di-2-thienyl-2',1',3'-benzothiadiazole)), poly[4,8-bis[(2-ethylhexyl) oxy]benzo[1,2-b:4,5-b']dithiophene-2,6-diyl][3-fluoro-2-[(2-ethylhexyl)carbonyl]'thieno[3,4-b] thiophenediyl], poly [(4,4'-bis(2-ethylhexyl)dithienol [3,2-b:2',3'-d]silole)-2,6-diyl-alt-(2,1,3-benzothiadiazole)-4, 7-diyl], or a combination thereof; and
the electron accepting material comprises (6,6)-phenyl-$C_{71}$ butyric acid methyl ester, (6,6)-phenyl-$C_{61}$ butyric acid methyl ester, or a combination thereof.

17. The polymer solar cell of claim 11, further comprising a hole transport layer disposed between the anode substrate and the photoactive layer.

18. The polymer solar cell of claim 17, wherein the hole transport layer comprises poly(ethylenedioxythiophene) and polystyrene sulfonate.

19. The polymer solar cell of claim 11, wherein
the anode substrate comprises indium tin oxide;
the photoactive layer comprises poly(4,8-bis-alkyloxy-benzo(1,2-b:4,5-b')dithiophene-2,6-diyl-alt-(alkylthieno(3,4-b)thiophene-2-(2-ethyl-1-hexanone)-2,6-diyl) and (6,6)-phenyl-$C_{71}$ butyric acid methyl ester;
the cathode metal layer comprises silver; and
the interlayer comprises the conjugated polymer zwitterion comprising repeating units having the structure (I)

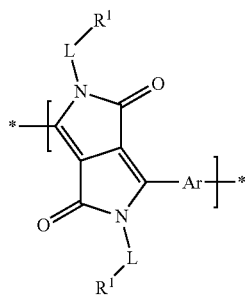

(I)

20. The polymer solar cell of claim 11, wherein
the anode substrate comprises indium tin oxide;
the photoactive layer comprises poly(4,8-bis-alkyloxy-benzo(1,2-b:4,5-b') dithiophene-2,6-diyl-alt-(alkylthieno(3,4-b)thiophene-2-(2-ethyl-1-hexanone)-2,6-diyl) and (6,6)-phenyl-$C_{71}$ butyric acid methyl ester;
the cathode metal layer comprises silver; and
the interlayer comprises the conjugated polymer zwitterion comprising repeating units having the structure (II)

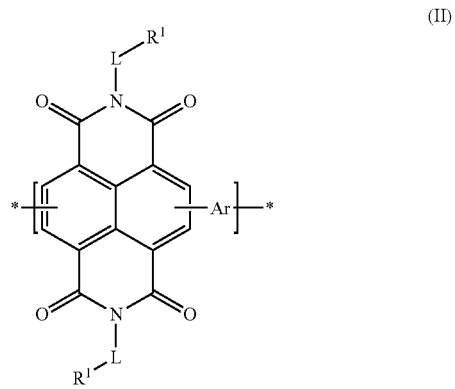

(II)

* * * * *